United States Patent
Choi et al.

(10) Patent No.: US 9,379,288 B2
(45) Date of Patent: Jun. 28, 2016

(54) SEMICONDUCTOR LIGHT EMITTING DEVICE, MANUFACTURING METHOD THEREOF, AND SEMICONDUCTOR LIGHT EMITTING DEVICE PACKAGE USING THE SAME

(71) Applicant: SAMSUNG ELECTRONICS CO., LTD., Seoul (KR)

(72) Inventors: Pun Jae Choi, Yongin-si (KR); Jae In Sim, Yongin-si (KR); Seok Min Hwang, Suwon-si (KR); Jin Hyun Lee, Suwon-si (KR); Myong Soo Cho, Yongin-si (KR); Ki Yeol Park, Daegu (KR)

(73) Assignee: SAMSUNG ELECTRONICS CO., LTD., Seoul (KR)

( * ) Notice: Subject to any disclaimer, the term of this patent is extended or adjusted under 35 U.S.C. 154(b) by 0 days.

(21) Appl. No.: 14/615,116

(22) Filed: Feb. 5, 2015

(65) Prior Publication Data

US 2015/0221843 A1    Aug. 6, 2015

Related U.S. Application Data

(60) Continuation-in-part of application No. 14/101,242, filed on Dec. 9, 2013, now Pat. No. 8,981,395, which is a continuation of application No. 13/568,553, filed on Aug. 7, 2012, now Pat. No. 8,624,276, which is a (Continued)

(30) Foreign Application Priority Data

Oct. 19, 2007    (KR) .......................... 10-2007-0105365

(51) Int. Cl.
*H01L 29/20*    (2006.01)
*H01L 33/38*    (2010.01)
(Continued)

(52) U.S. Cl.
CPC ................ *H01L 33/38* (2013.01); *H01L 33/20* (2013.01); *H01L 33/382* (2013.01);
(Continued)

(58) Field of Classification Search
CPC ..... H01L 33/20; H01L 33/382; H01L 33/405; H01L 33/38; H01L 2224/48091; H01L 2924/00014
See application file for complete search history.

(56) References Cited

U.S. PATENT DOCUMENTS 6,201,265 B1    3/2001    Teraguchi
6,255,129 B1    7/2001    Lin
(Continued)

FOREIGN PATENT DOCUMENTS

DE    100 26 255 A1    11/2001
DE    10325951 A1    12/2003
(Continued)

OTHER PUBLICATIONS

German Office Action, w/ English translation thereof, issued in German Patent Application No. 10 2009 010 480.1 dated Oct. 14, 2009.
(Continued)

*Primary Examiner* — Ahmed Sefer
(74) *Attorney, Agent, or Firm* — McDermott Will & Emery LLP

(57) ABSTRACT

There is provided a semiconductor light emitting device comprising a semiconductor stack having first and second main surfaces opposing each other, and comprising first and second conductivity-type semiconductor layers respectively defining the first and second main surfaces, and an active layer interposed between the first and second conductivity-type semiconductor layers; a plurality of contact holes penetrating the second conductivity-type semiconductor layer and the active layer, and one region of the first conductivity-type semiconductor layer; a first electrode layer disposed on the second main surface of the semiconductor stack, the first electrode layer extending and being connected to the one region of the first conductivity-type semiconductor layer through the contact holes; a second electrode layer disposed between the semiconductor stack and the first electrode layer and connected to the second conductivity-type semiconductor layer; and first and second interconnected bumps.

20 Claims, 28 Drawing Sheets

Related U.S. Application Data continuation of application No. 13/163,107, filed on Jun. 17, 2011, now Pat. No. 8,263,987, which is a continuation of application No. 12/757,557, filed on Apr. 9, 2010, now Pat. No. 7,985,976, which is a division of application No. 12/189,428, filed on Aug. 11, 2008, now Pat. No. 7,964,881.

(51) Int. Cl.

| | | |
|---|---|---|
| *H01L 33/20* | (2010.01) | |
| *H01L 33/40* | (2010.01) | |
| H01L 33/22 | (2010.01) | |
| H01L 33/46 | (2010.01) | |
| H01L 33/62 | (2010.01) | |
| H01L 23/00 | (2006.01) | |

(52) U.S. Cl.
CPC .............. *H01L 33/405* (2013.01); *H01L 24/32* (2013.01); *H01L 24/48* (2013.01); *H01L 24/73* (2013.01); *H01L 33/22* (2013.01); *H01L 33/46* (2013.01); *H01L 33/62* (2013.01); *H01L 2224/32245* (2013.01); *H01L 2224/48091* (2013.01); *H01L 2224/48247* (2013.01); *H01L 2224/48465* (2013.01); *H01L 2224/73265* (2013.01); *H01L 2924/00014* (2013.01)

(56) References Cited

U.S. PATENT DOCUMENTS

| | | | |
|---|---|---|---|
| 6,372,608 B1 | 4/2002 | Shimoda et al. | |
| 6,455,343 B1 * | 9/2002 | Chen ................... | H01L 33/145 257/97 |
| 6,459,100 B1 | 10/2002 | Doverspike et al. | |
| 6,645,830 B2 | 11/2003 | Shimoda et al. | |
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,828,596 B2 | 12/2004 | Steigerwald et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 2003/0230754 A1 | 12/2003 | Steigerwald et al. | |
| 2004/0217360 A1 | 11/2004 | Negley | |
| 2005/0012109 A1 | 1/2005 | Kohno et al. | |
| 2005/0127374 A1 | 6/2005 | Lin et al. | |
| 2006/0060880 A1 | 3/2006 | Lee et al. | |
| 2006/0281203 A1 | 12/2006 | Epler et al. | |
| 2007/0114564 A1 | 5/2007 | Lee et al. | |
| 2007/0176188 A1 | 8/2007 | Tanaka et al. | |
| 2007/0181895 A1 | 8/2007 | Nagai | |
| 2008/0179605 A1 | 7/2008 | Takase et al. | |
| 2008/0191215 A1 | 8/2008 | Choi et al. | |
| 2008/0237622 A1 | 10/2008 | Choi et al. | |
| 2008/0277674 A1 | 11/2008 | Nagai et al. | |
| 2008/0303055 A1 | 12/2008 | Seong | |
| 2009/0065800 A1 | 3/2009 | Wirth et al. | |
| 2009/0101923 A1 | 4/2009 | Choi et al. | |
| 2009/0146165 A1 * | 6/2009 | Hasnain ................ | H01L 33/382 257/98 |
| 2009/0166663 A1 | 7/2009 | Sakai | |
| 2009/0173952 A1 | 7/2009 | Takeuchi et al. | |
| 2010/0171135 A1 | 7/2010 | Engl et al. | |

FOREIGN PATENT DOCUMENTS

| | | |
|---|---|---|
| DE | 102005007601 A1 | 9/2005 |
| DE | 10 2007 022 947 A1 | 10/2008 |
| JP | 2003-347653 A | 12/2003 |
| JP | 2005-322722 A | 11/2005 |
| JP | 2010525585 A | 7/2010 |
| KR | 10-2006-0010527 | 2/2006 |
| WO | 03/044872 A1 | 5/2003 |
| WO | 2007/074969 A1 | 7/2007 |

OTHER PUBLICATIONS

Korean Office Action, with English translation, issued in Korean Patent Application No. 10-2007-0105365, dated Jan. 29, 2009.

United States Office Action issued in U.S. Appl. No. 12/189,428 dated Aug. 6, 2010.

United States Office Action issued in U.S. Appl. No. 12/189,428 dated Aug. 26, 2010.

United States Office Action issued in U.S. Appl. No. 12/189,428 dated Nov. 17, 2010.

Office Action issued Nov. 20, 2012 in the co-pending Japanese Patent Application No. 2010-061569.

Chinese Office Action, w/ English translation thereof, issued in Chinese Patent Application No. CN 201110456822.7 dated Dec. 17, 2013.

Office Action issued in U.S. Appl. No. 14/101,242, dated May 28, 2014.

Notice of Allowance issued in U.S. Appl. No. 14/101,242, dated Nov. 5, 2014.

German Office Action, w/ English translation thereof, issued in German Patent Application No. 102009061061.8 dated Jun. 24, 2015.

* cited by examiner

SEMICONDUCTOR LIGHT EMITTING DEVICE, MANUFACTURING METHOD THEREOF, AND SEMICONDUCTOR LIGHT EMITTING DEVICE PACKAGE USING THE SAME

CROSS-REFERENCE TO RELATED APPLICATION

This application is a Continuation-In-Part of U.S. application Ser. No. 14/101,242 filed Dec. 9, 2013, which is a Continuation of U.S. application Ser. No. 13/568,553, filed on Aug. 7, 2012, which is a Continuation of U.S. application Ser. No. 13/163,107, filed on Jun. 17, 2011, which is a Continuation of U.S. application Ser. No. 12/757,557, filed on Apr. 9, 2010, which is a Divisional of U.S. application Ser. No. 12/189,428, filed on Aug. 11, 2008, which claims benefit of priority to Korean Patent Application No. 10-2007-0105365 filed on Oct. 19, 2007, with the Korean Intellectual Property Office, the entire contents of which are incorporated herein by reference.

BACKGROUND

The present inventive concept relates to a semiconductor light emitting device, a manufacturing method thereof, and a semiconductor light emitting device package using the same, and more particularly, to a semiconductor light emitting device that ensures a maximum light emitting area to maximize luminous efficiency and perform uniform current spreading by using an electrode having a small area, and enables mass production at low cost with high reliability and high quality, a manufacturing method thereof, and a semiconductor light emitting device package using the same.

Semiconductor light emitting devices in materials that emit light. For example, light emitting diodes (LEDs) are devices that use diodes, to which semiconductors are bonded, convert energy generated by combination of electrons and holes into light, and emit light. The semiconductor light emitting devices are being widely used as lighting, display devices, and light sources, and development of semiconductor light emitting devices has been expedited.

Specifically, semiconductor light emitting devices having various structures, where light is emitted by electron-hole recombination, have been proposed to enhance light extraction efficiency thereof.

SUMMARY

An aspect of the present inventive concept may provide a semiconductor light emitting device that minimize the reflection or absoption of emitted light, and ensures high luminous efficiency by securing a maximum light emitting area, a manufacturing method thereof, and a semiconductor light emitting device package using the same.

An aspect of the present inventive concept may also provide a semiconductor light emitting device that ensures uniform current spreading, high reliability, efficient mass-production at low cost, and high quality, a manufacturing method thereof, and a semiconductor light emitting device package using the same.

According to an aspect of the present invention, there is provided a semiconductor light emitting device comprising a semiconductor stack having first and second main surfaces opposing each other, and comprising first and second conductivity-type semiconductor layers respectively defining the first and second main surfaces, and an active layer interposed between the first and second conductivity-type semiconductor layers; a plurality of contact holes penetrating the second conductivity-type semiconductor layer and the active layer, and one region of the first conductivity-type semiconductor layer; a first electrode layer disposed on the second main surface of the semiconductor stack, the first electrode layer extending and being connected to the one region of the first conductivity-type semiconductor layer through the contact holes; a second electrode layer disposed between the semiconductor stack and the first electrode layer and connected to the second conductivity-type semiconductor layer; and first and second interconnected bumps comprising: first and second under bump metallurgy (UBM) layers respectively connected to the first and second electrode layers; first and second intermetallic compound (IMC) layers respectively disposed on the first and the second UBM layers; first and second solder bumps respectively disposed on the first and second IMC layers, wherein the solder bumps are bonded to the UBM layers by the IMC layers; and first and second barrier layers covering lateral surfaces of the first and second UBM layers respectively, wherein the first and second interconnected bumps are disposed opposite to the first main surface.

The semiconductor light emitting device may further comprise an insulator disposed between the first electrode layer and second electrode layer.

The contact holes may penetrate the second electrode layer to thereby be connected to the first electrode layer.

The semiconductor light emitting device may further comprise a support substrate disposed on the first electrode layer; and first and second conductive vias respectively connected to the first and second interconnected bumps, wherein the first conductive via penetrates the support substrate to thereby be connected to the first electrode layer, and the second conductive via penetrates the support substrate and the first electrode layer to thereby be connected to the second electrode layer.

The semiconductor light emitting device may further comprise first and second electrode pads respectively connected to the first and second conductive vias, wherein the electrode pads are interposed between the conductive vias and the interconnected bumps.

The semiconductor light emitting device may further comprise an insulator, covering lateral surfaces of the first and second conductive vias and a portion of a bottom surface of the support substrate, and exposing bottom surfaces of the first and second conductive vias.

An irregular pattern may be formed on a surface of the first conductivity-type semiconductor layer opposite to another surface of the first conductivity-type semiconductor layer interfacing with the active layer.

The barrier layers may have lower wettability to the IMC layers and the solder bumps than the UBM layers.

The barrier layers may comprise oxide layers containing at least one component constituting the UBM layers.

The lateral surfaces of the UBM layers may be inclined with respect to the second main surface.

The lateral surfaces of the UBM layers may be perpendicular to the second main surface.

According to another aspect of the present invention, there is provided a semiconductor light emitting device having a first conductivity-type semiconductor layer, an active layer, a second conductivity-type semiconductor layer, a second electrode layer, and an insulating layer, a first electrode layer, and a support substrate sequentially laminated, wherein: the second electrode layer has an exposed area at the interface between the second electrode layer and the second conductivity-type semiconductor layer; the first electrode layer comprises at least one contact hole electrically connected to the first conductivity-type semiconductor layer, electrically insulated from the second conductivity-type semiconductor layer and the active layer, and extending from one surface of the first electrode layer to at least part of the first conductivity-type semiconductor layer; and a multilayered reflective structure disposed between the first electrode layer and the second electrode layer, covering lateral surfaces of the at least one contact hole and exposing bottom surfaces of the at least one contact hole, wherein the multilayered reflective structure comprises a plurality of insulating layers, and wherein the plurality of insulating layers having different refractive indices are alternately stacked.

The semiconductor light emitting device may further comprise an electrode pad unit formed at the exposed area of the second electrode layer.

The exposed area of the second electrode layer may be a region exposed by a via hole formed through the first conductivity-type semiconductor layer, the active layer, and the second conductivity-type semiconductor layer.

The diameter of the via hole may increase in a direction from the second electrode layer toward the first conductivity-type semiconductor layer.

The semiconductor light emitting device may further comprise an additional multilayered reflective structure disposed on a lateral surface of the via hole.

The exposed area of the second electrode layer may be formed at the edge of the semiconductor light emitting device.

An irregular pattern may be formed on the surface of the first conductivity-type semiconductor layer.

The multilayered reflective structure may be a distributed Bragg reflector (DBR), comprising first and second insulating layers, and wherein the first and second insulating layer having different refractive indices from each other are alternately stacked.

Each of the plurality of insulating layers may be composed of one selected from the group consisting of silicon oxide, silicon nitride, aluminum oxide, hafnium oxide, titanium dioxide, zirconium oxide, and combinations thereof.

BRIEF DESCRIPTION OF DRAWINGS

The above and other aspects, features and advantages of the present inventive concept will be more clearly understood from the following detailed description taken in conjunction with the accompanying drawings, in which.

DETAILED DESCRIPTION

Figure 1:
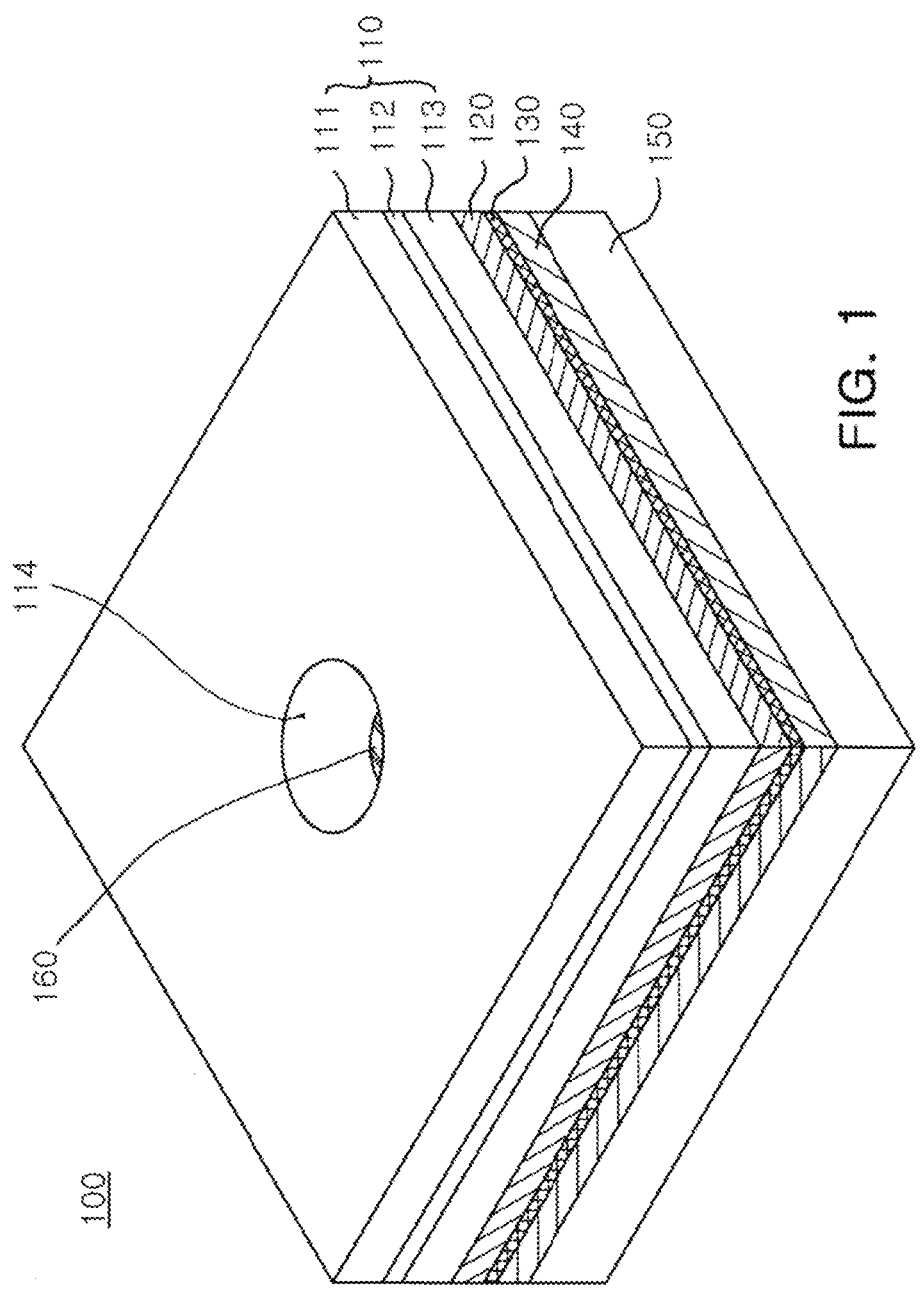
FIG. 1 is a perspective view illustrating a semiconductor light emitting device according to an exemplary embodiment of the present inventive concept.

Exemplary embodiments of the present inventive concept will now be described in detail with reference to the accompanying drawings. Embodiments of the present inventive concept are provided for fully conveying the concept of the present inventive concept to those of ordinary skill in the art. The present inventive concept may be embodied in many different forms and should not be construed as being limited to the embodiments set forth herein; rather, these embodiments are provided so that this disclosure will be thorough and complete, and will fully convey the concept of the present inventive concept to those of ordinary skill in the art. Also, a thickness of a size of each layer in the drawings may be exaggerated for convenience of description and clarity of the specification.

Throughout the specification, it will be understood that when an element such as a film, a region, or a wafer (substrate) is referred to as being positioned to be "on" or "connected to" another element, it can be on, connected, or coupled to the other element, or intervening elements may be present. However, when an element is referred to as being positioned to be "directly on" or "directly connected to", or "directly coupled to" another element, it will be understood that intervening elements are not present. The same reference numerals will be used throughout to designate the same or like elements. As used herein, the term and/or includes any and all combinations of one or more of the associated listed items.

Also, though terms like a first and a second are used to describe various members, components, regions, layers, and/or portions in various embodiments of the present inventive concept, the members, components, regions, layers, and/or portions are not limited to these terms. These terms are used only to differentiate one member, component, region, layer, or portion from others thereof. Therefore, a member, a component, a region, a layer, or a portion referred to as a first member, a first component, a first region, a first layer, or a first portion in an embodiment may be referred to as a second member, a second component, a second region, a second layer, or a second portion in another embodiment.

Also, relative terms such as "on", "upper", "under", or "below" may be used to describe relationships of certain elements to other elements as depicted in the drawings. Relative terms may be understood as intending the inclusion of other directions of a device in addition to directions illustrated in the drawings. For example, when a device is turned over in the drawings, elements illustrated to be present on surfaces of other elements may be oriented under the foregoing other elements. Thus, for example, the term "on" may include both directions of "under" and "on" relying on a particular direction of drawings. When an element is oriented in a different direction (rotated by 90 degrees with respect to the different direction), relative descriptions used in this disclosure may be interpreted accordingly.

The technical terms used in this disclosure are only used for explaining a specific exemplary embodiment while not limiting the present inventive concept. The terms of a singular form may include plural forms unless, from context, referred only to a singular form definitely. Also, it will be further understood that the terms "comprise" and/or "comprising," when used herein, specify the presence of stated features, integers, steps, operations, elements, and/or components, but do not preclude the presence or addition of one or more other features, steps, operations, elements, components, and/or groups thereof.

Hereinafter, ideal exemplary embodiments of the present inventive concept will be described with reference to the accompanying drawings. In the accompanying drawings, for example, modifications of an illustrated shape may be expected according to manufacturing technology and/or tolerance. Therefore, embodiments of the present inventive concept should not be construed as being limited to a specific shape of a region illustrated in the drawing, and for example, should include a shape change caused in a manufacturing process. Hereinafter, exemplary embodiments of the present inventive concept may be configured as a combination of each of a plurality of exemplary embodiments or a plurality of exemplary embodiments.

A semiconductor light emitting device described hereinafter may have various components, and here, only vital components will be illustrated and the contents of the present inventive concept is not limited thereto.

Figure 2:
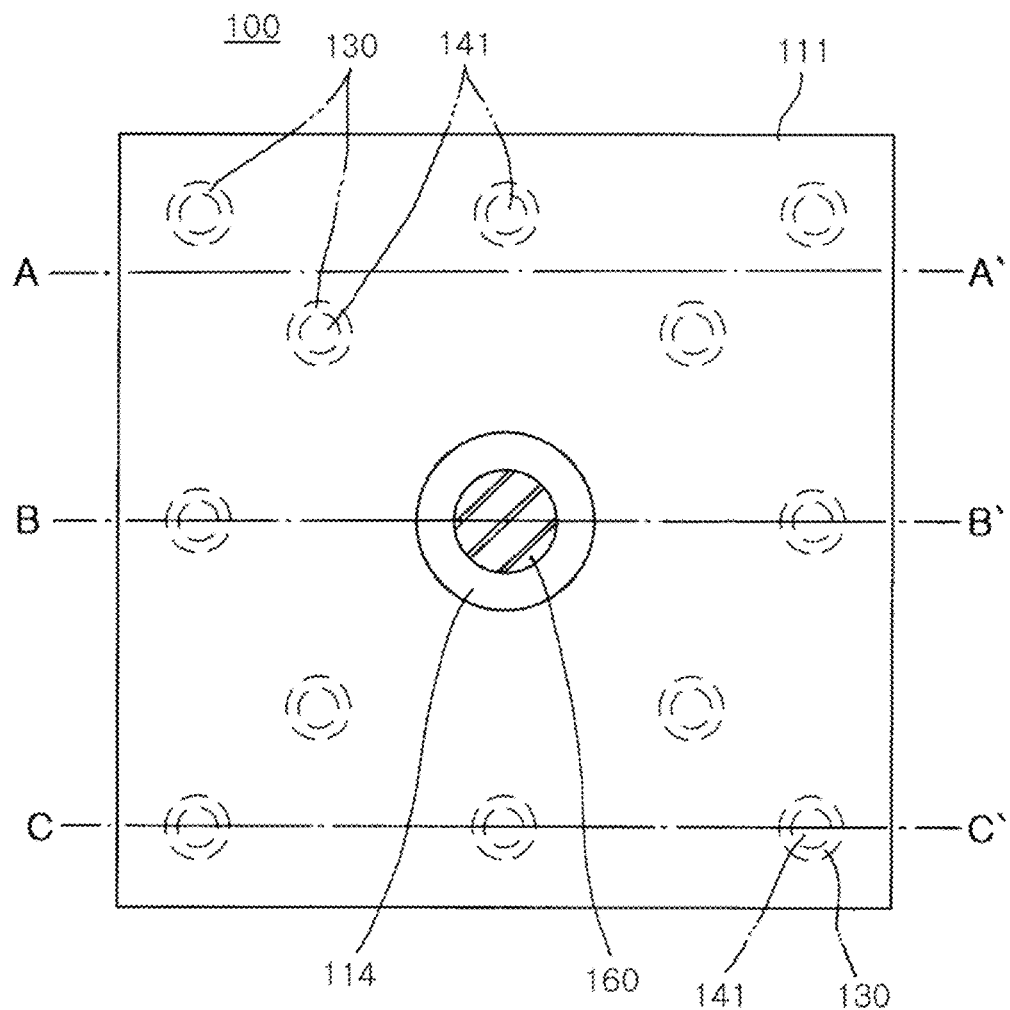
FIG. 2 is a plan view of the semiconductor light emitting device of FIG. 1.

FIG. 1 is a perspective view illustrating a semiconductor light emitting device according to an exemplary embodiment of the present inventive concept, and FIG. 2 is a plan view of the semiconductor light emitting device of FIG. 1. Hereinafter, the semiconductor light emitting device according to the exemplary embodiment will be described with reference to FIGS. 1 and 2.

The semiconductor light emitting device 100 according to an exemplary embodiment of the present inventive concept includes a first conductivity-type semiconductor layer 111, an active layer 112, a second conductivity-type semiconductor layer 113, a second electrode layer 120, a first insulating layer 130, a first electrode layer 140, and a conductive substrate 150, sequentially stacked. Here, the second electrode layer 120 has an exposed area at the interface between the second electrode layer 120 and the second conductivity-type semiconductor layer 113, and the first electrode layer 140 includes at least one contact hole 141 electrically connected to the first conductivity-type semiconductor layer 111, electrically insulated from the second conductivity-type semiconductor layer 113 and the active layer 112, and extending from one surface of the first electrode layer 140 to at least part of the first conductivity-type semiconductor layer 113.

In the semiconductor light emitting device 100, light emission is performed by the first conductivity-type semiconductor layer 111, the active layer 112, and the second conductivity-type semiconductor layer 113, and thus, these elements well be referred to as a light emitting laminate (or a semiconductor stack) 110. Namely, the semiconductor light emitting device 100 includes the light emitting laminate 110, the first electrode layer 140 electrically connected to the first conductivity-type semiconductor layer 111, the second electrode layer 120 electrically connected to the second conductivity-type semiconductor layer 113, and the first insulating layer 130 electrically insulating the electrode layers 120 and 140. Also, the semiconductor light emitting device 100 includes the conductive substrate 150 as a substrate for growing or supporting the semiconductor light emitting device 100.

The semiconductor layers 111 and 113 may include a semiconductor such as a GaN-based semiconductor, a ZnO-based semiconductor, a GaAs-based semiconductor, a GaP-based semiconductor, and a GaAsP-based semiconductor. The semiconductor layers 111 and 113 may be formed by using, for example, a molecular beam epitaxy (MBE) method. In addition, the semiconductor layers 111 and 113 may be formed by appropriately selecting a semiconductor from the group consisting of Group III-V semiconductors, Group II- VI semiconductors, and silicon (Si). The semiconductor layers 111 and 113 may be formed by doping the foregoing semiconductors with impurities in consideration of each conductivity-type.

The active layer 112, a layer activating light emission, is formed with a material having an energy band gap smaller than those of the first conductivity-type semiconductor layer 111 and the second conductivity-type semiconductor layer 113. For example, when the first conductivity-type semiconductor layer 111 and the second conductivity-type semiconductor layer 113 are GaN-based compound semiconductors, the active layer 112 may be formed using an InAlGaN-based compound semiconductor having an energy band gap smaller than that of GaN. Namely, the active layer 112 may include $In_xAl_yGa_{(1-x-y)}N$, where $0 \leq x \leq 1$, $0 \leq y \leq 1$, and $0 \leq x+y \leq 1$.

Here, it is preferable for the active layer 112 not to be doped with an impurity in consideration of the characteristics of the active layer 112, and a wavelength of emitted light may be adjusted by adjusting a mole ratio of a constituent material. Thus, the semiconductor light emitting device 100 may emit at least one among infrared light, visible light, and UV light according to characteristics of the active layer 112.

The electrode layers 120 and 140 are layers for applying a voltage to the semiconductor layers having the same conductivity-type, and thus, the electrode layers 120 and 140 may include a metal in consideration of electrical conductivity. That is, the electrode layers 120 and 140 electrically connect the semiconductor layers 111 and 113 to an external power source (not shown). The electrode layers 120 and 140 may include, for example, titanium (Ti) in an n-type electrode and palladium (Pd) or gold (Au) in a p-type electrode.

The first electrode layer 140 is connected to the first conductivity-type semiconductor layer 111 and the second electrode layer 120 is connected to the second conductivity-type semiconductor layer 113, and thus, the first electrode layer 140 and the second electrode layer 120 are electrically separated by the first insulating layer 130 in terms of their characteristics connected to the different conductivity-types. Since the first insulating layer 130 is formed of a material having low electrical conductivity, the first insulating layer 130 may include, for example, an oxide such as $SiO_2$.

The second electrode layer 120 preferably reflects light generated by the active layer 112. Since the second electrode layer 120 is positioned below the active layer 112, the second electrode layer 120 is positioned on the opposite side of a light emission direction of the semiconductor light emitting device 100 with respect to the active layer 112. Light, travelling in a direction opposite to that of the light emitting direction of the semiconductor light emitting device 100, namely, from the active layer 112 toward the second electrode layer 120, needs to be reflected to increase luminous efficiency. Thus, if the second electrode layer 120 is light-reflective, reflected light may be oriented toward the light emitting surface and luminous efficiency of the semiconductor light emitting device 100 may be increased.

In order to reflect light generated by the active layer 112, the second electrode layer 120 is preferably a metal which has white color as seen in visible light. For example, the metal may be one of silver (Ag), aluminum (Al), and platinum (Pt).

The second electrode layer 120 includes an exposed area at the interface between the second electrode layer 120 and the second conductivity-type semiconductor layer 113. The first electrode layer 140 is in contact with the conductive substrate 150 below the first electrode layer 140 and electrically connected to an external power source (not shown) through the conductive substrate 150. However, in order to be connected to an external power source (not shown), the second electrode layer 120 requires a separate connection region. Thus, the second electrode layer 120 has the exposed region exposed by etching a portion of the light emitting laminate 110. In FIG. 2, an exemplary embodiment in which the center of the light emitting laminate 110 is etched to form a via hole 114 in order to provide the exposed region of the second electrode layer 120 is illustrated. An electrode pad unit may be further formed on the exposed region of the second electrode layer 120. The second electrode layer 120 may be electrically connected to an external power source (not shown) through the exposed region, and here, the second electrode layer 120 is electrically connected to the external power source (not shown) using the electrode pad unit 160. Connection to the external power source (not shown) may be made using a wire, for example, and thus, preferably, the diameter of the via hole 114 may increase in a direction toward the first conductivity-type semiconductor layer 111 from the second electrode layer 120, for convenience of connection.

The via hole 114 may be formed through selective etching such that only the light emitting laminate 110 including the semiconductors is etched and the second electrode layer 120 generally including a metal is not etched. The diameter of the via hole 114 may be appropriately selected by a person skilled in the art to which the present inventive concept pertains, in consideration of a light emitting area, electrical connection efficiency, and current spreading in the second electrode layer 120.

The first electrode layer 140 includes at least one contact hole 141 electrically connected to the first conductivity-type semiconductor layer 111, electrically insulated from the second conductivity-type semiconductor layer 113 and the active layer 112, and extending to at least part of the first conductivity-type semiconductor layer 111. That is, in order to connect the first conductivity-type semiconductor layer 111 to an external power source (not shown), the first electrode layer 140 includes at least one contact hole 141 extending to the first conductivity-type semiconductor layer 111 by penetrating the second electrode layer 120 disposed between the first electrode layer 140 and the second conductivity-type semiconductor layer 113, the second conductivity-type semiconductor layer 113, and the active layer 112, and including an electrode material.

If the contact hole 141 serves only for an electrical connection, the first electrode layer 140 may include only a single contact hole 141. However, in order to distribute current transmitted to the first conductivity-type semiconductor layer 111 uniformly, the first electrode layer 140 may have a plurality of contact holes 141 in predetermined positions.

The conductive substrate 150 may be in contact with the second electrode layer 120 so as to be electrically connected. The conductive substrate 150 may be a metal substrate or a semiconductor substrate. When the conductive substrate 150 is a metal substrate, the metal substrate may be formed of any one of gold (Au), nickel (Ni), copper (Cu), and tungsten (W). Also, when the conductive substrate 150 is a semiconductor substrate, the semiconductor substrate may be formed of any one of silicon (Si), germanium (Ge), and GaAs. The conductive substrate 150 may be a growth substrate or may be a support substrate bonded after a non-conductive substrate such as a sapphire substrate having relatively low lattice mismatch is used as a growth substrate and removed.

When the conductive substrate 150 is a support substrate, the conductive substrate 150 may be formed using a plating method or a substrate bonding method. In detail, Forming the conductive substrate 150 in the semiconductor light emitting device 100 may be performed by forming a plating seed layer and thereby preparing a subsrate (the plating method), or of bonding the separately prepared conductive substrate 150 by using a conductive bonding agent such as gold (Au), gold-tin alloy (Au—Sn), or lead-strontium alloy (Pb—Sr) (the substrate bonding method).

Referring to FIG. 2, a plan view of the semiconductor light emitting device 100 is illustrated. The via hole 114 is formed on an upper surface of the semiconductor light emitting device 100, and the electrode pad unit 160 is positioned in the exposed region of the second electrode layer 120. In addition, although not shown in the upper surface of the semiconductor light emitting device 100, the contact holes 141 are indicated by the dotted lines to show positions of the contact holes 141. In order to electrically separate each contact hole 141 from the second electrode layer 120, the second conductivity-type semiconductor layer 113, and the active layer 112, the first insulating layer 130 may be extended along the circumference of each contact hole 141. This will be described in more detail with reference to FIGS. 3B and 3C.

Figure 3A:
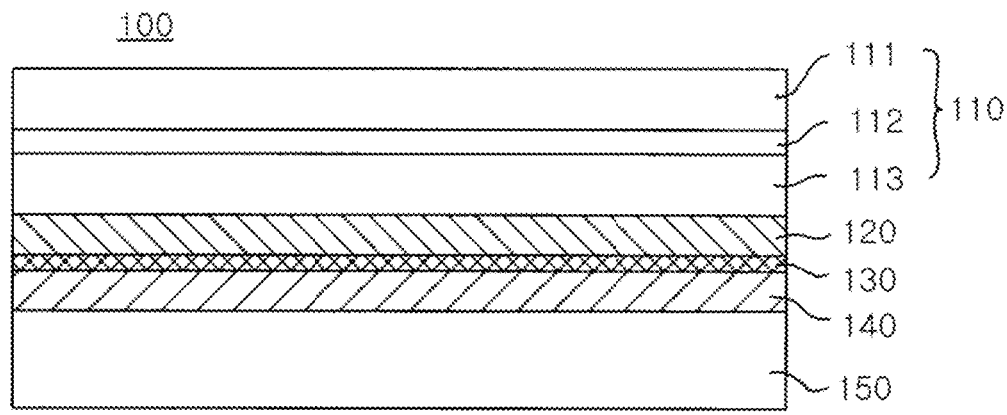
FIGS. 3A through 3C are cross-sectional views of the semiconductor light emitting device illustrated in FIG. 2, taken along lines A-A', B-B', and C-C', respectively.
Figure 3B:
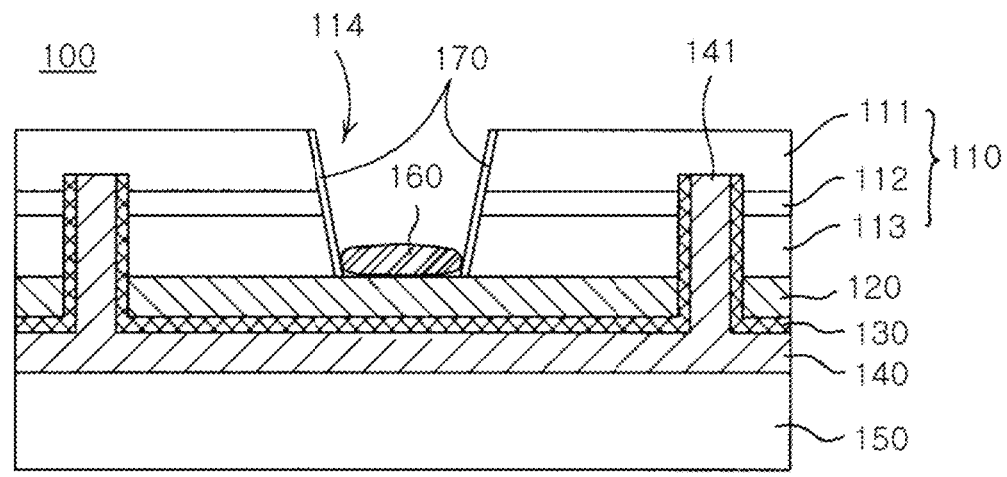
Figure 3C:
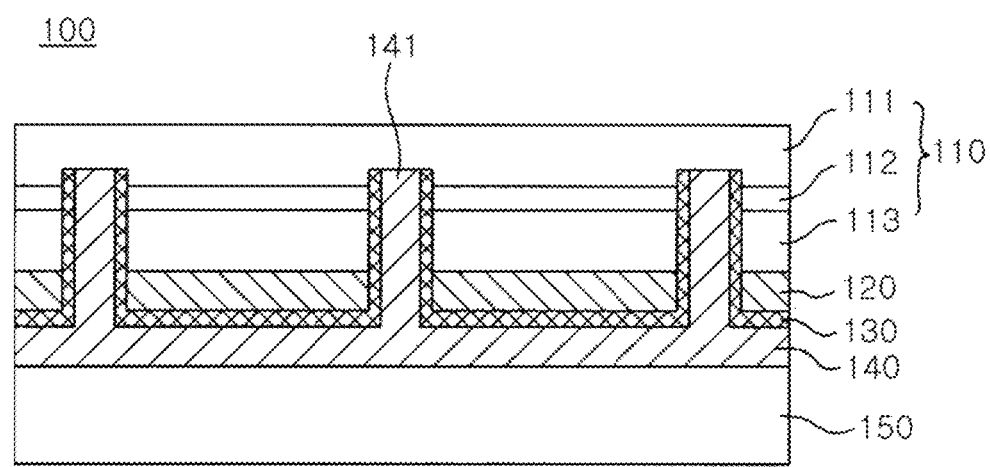

FIGS. 3A through 3C are cross-sectional views of the semiconductor light emitting device illustrated in FIG. 2, taken along lines A-A', B-B', and C-C', respectively. Line A-A' is selected to take the cross-section of the semiconductor light emitting device 100, line B-B' is selected to take the cross-section including the contact holes 141 and the via hole 114, and line C-C' is selected to take the cross-section including only the contact holes 141. This will be described with reference to FIGS. 1 through 3C hereinafter.

Referring to FIG. 3A, the contact holes 141 or the via hole 114 do not appear. Since the contact holes 141 are electrically connected through the first electrode layer 140, rather than being connected by a separate connection line, the contact holes 141 are not shown in the A-A' cross-section.

Referring to FIGS. 3B and 3C, the contact holes 141 extend from the interface between the first electrode layer 140 and the second electrode layer 120 to the interior of the first conductivity-type semiconductor layer 111. The contact holes 141 extend to the first conductivity-type semiconductor layer 112 by penetrating through the second conductivity-type semiconductor layer 113 and the active layer 112, and extend at least to an interface between the active layer 112 and the first conductivity-type semiconductor layer 111. Preferably, the contact holes 141 extend to part of the first conductivity-type semiconductor layer 111. However, since the contact holes 141 serve for electrical connection and current spreading, the purpose of the presence of the contact holes 141 is achieved when the contact holes 141 are in contact with the first conductivity-type semiconductor layer 111, without having to extend to an external surface of the first conductivity-type semiconductor layer 111.

Since the contact holes 141 serve to distribute current to the first conductivity-type semiconductor layer 111, the contact holes 141 need to have a predetermined area. Preferably, a predetermined number of contact holes 141 are formed to have an area as small as possible but to sufficiently distribute current uniformly on the first conductivity-type semiconductor layer 111. If the number of the contact holes 141 is too small, it may be difficult to distribute current, degrading electrical characteristics, and if the number of the contact holes 141 is too large, the process of forming the contact holes may be hard to be performed and the light emitting area may be reduced due to the reduction of the active layer. In consideration of these conditions, the number of the contact holes 141 may be appropriately selected. Thus, the contact holes 141 are configured to occupy an area as small as possible but ensure effective current spreading.

The contact holes 141 are formed to extend from the second electrode layer 120 to the interior of the first conductivity-type semiconductor layer 111, and since the contact holes 141 serve to distribute current of the first conductivity-type semiconductor layer 111, the contact holes 141 need to be electrically separated from the second conductivity-type semiconductor layer 113 and the active layer 112. Thus, it is preferred for the contact hole 141 to be electrically separated from the second electrode layer 120, the second conductivity-type semiconductor layer 113, and the active layer 112. Thus, the first insulating layer 130 may extend to cover the circumference of the contact holes 141. Electrical separation may be performed using an insulating material such as a dielectric material.

In FIG. 3B, the exposed region of the second electrode 120 is a region for electrical connection of the second electrode 120 to an external power source (not shown). The electrode pad unit 160 may be positioned in the exposed region. Here, a second insulating layer 170 may be formed on an inner surface of the via hole 114 to electrically separate the light emitting laminate 110 and the electrode pad unit 160.

In FIG. 3A, the first electrode layer 140 and the second electrode layer 120 are positioned on the same plane, and thus, the semiconductor light emitting device 100 exhibits characteristics of a horizontal semiconductor light emitting device, and in FIG. 3B, since the electrode pad unit 160 is positioned on the surface of the second conductivity-type semiconductor layer 120, the semiconductor light emitting device 100 exhibits characteristics of a vertical semiconductor light emitting device. Thus, the semiconductor light emitting device 100 has a structure integrating horizontal and vertical semiconductor light emitting devices.

In FIGS. 3A through 3C, the first conductivity-type semiconductor layer 111 may be an n-type semiconductor layer and the first electrode layer 140 may be an n-type electrode. In this case, the second conductivity-type semiconductor layer 113 may be a p-type semiconductor layer and the second electrode layer 120 may be a p-type electrode. Thus, the first electrode layer 140 as an n-type electrode and the second electrode layer 120 as a p-type electrode are electrically insulated with the first insulating layer 130 interposed therebetween.

Figure 4:
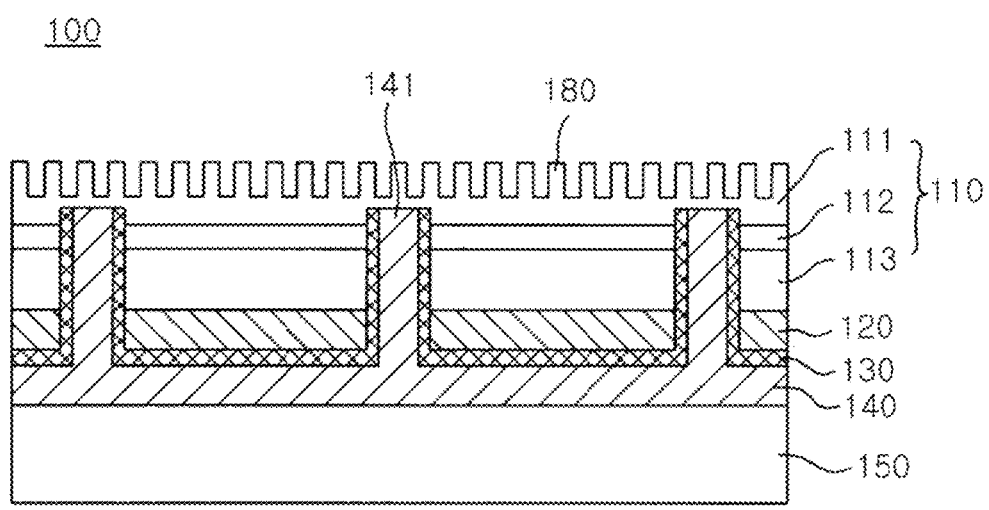
FIG. 4 is a view illustrating light emission of a semiconductor light emitting device with an irregular pattern formed on a surface thereof according to an exemplary embodiment of the present inventive concept.

FIG. 4 is a view illustrating light emissions of a semiconductor light emitting device with an irregular pattern formed on a surface thereof according to an exemplary embodiment of the present inventive concept. Descriptions of components already described above will be omitted.

In the semiconductor light emitting device 100, the outermost surface in a direction in which the emitted light is headed is the first conductivity-type semiconductor layer 111. Thus, an irregular pattern 180 may be easily formed on the surface using a known method such as a photolithography method. In this case, light emitted from the active layer 112 may be extracted after passing through the irregular pattern 180 formed on the surface of the first conductivity-type semiconductor layer 111, and light extraction efficiency may be increased by the irregular pattern 180.

The irregular pattern 180 may have a photonic crystal structure. The photonic crystal refers to a regular arrangement of mediums having different refractive indices, like a crystal. With the photonic crystal, light may be adjusted in units of length of a multiple of a wavelength of light, such that light extraction efficiency may be further increased.

Figure 5:
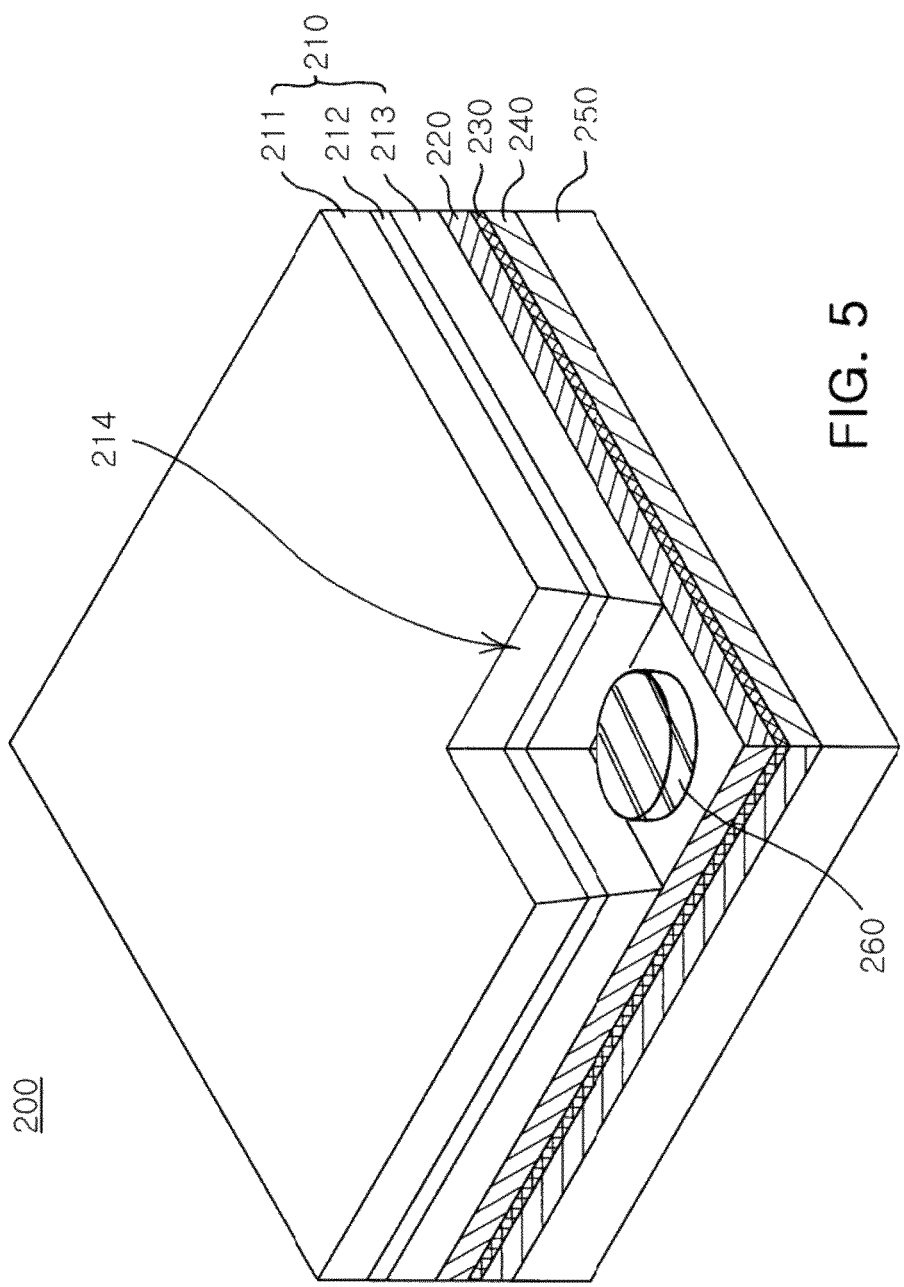
FIG. 5 is a view illustrating a semiconductor light emitting device in which a second electrode layer is exposed at the corner thereof according to an exemplary embodiment of the present inventive concept.

FIG. 5 is a view illustrating a semiconductor light emitting device in which a second electrode layer is exposed at the corner thereof according to an exemplary embodiment of the present inventive concept.

According to a different aspect of the present inventive concept, a method for manufacturing a semiconductor light emitting device includes sequentially stacking a first conductivity-type semiconductor layer 211, an active layer 212, a second conductivity-type semiconductor layer 213, a second electrode layer 220, an insulating layer 230, a first electrode layer 240, and a conductive substrate 250; forming an exposed region of the second electrode 220 at the interface between the second electrode layer 220 and the second conductivity-type semiconductor layer 213; and forming the first electrode layer 240 to include one or more contact holes electrically connected to the first conductivity-type semiconductor layer 211, electrically insulated from the second conductivity-type semiconductor layer 213 and the active layer 212, and extending from one surface of the first electrode layer 240 to at least part of the first conductivity-type semiconductor layer 211.

Here, the exposed region of the second electrode layer 220 is prepared by forming a via hole 214 in a light emitting laminate 210 (please refer to FIG. 1) or may be formed by mesa-etching the light emitting laminate 210 as illustrated in FIG. 5. In the present exemplary embodiment, descriptions of components the same as those of the previous exemplary embodiment described above with reference to FIG. 1 will be omitted.

Referring to FIG. 5, a corner of a semiconductor light emitting device 200 is mesa-etched. Etching is performed on the light emitting laminate 210 to expose the second electrode layer 220 from the interface between the second electrode layer 220 and the second conductivity-type semiconductor layer 213. Thus, the exposed region of the second electrode layer 220 is formed at the corner of the semiconductor light emitting device 200. The forming of the exposed region of the second electrode layer 220 at the corner of the semiconductor light emitting device 200 is simpler than the case of forming the via hole such as in the previous exemplary embodiment described above, and an electrical connection process may also be easily performed later.

Figure 6:
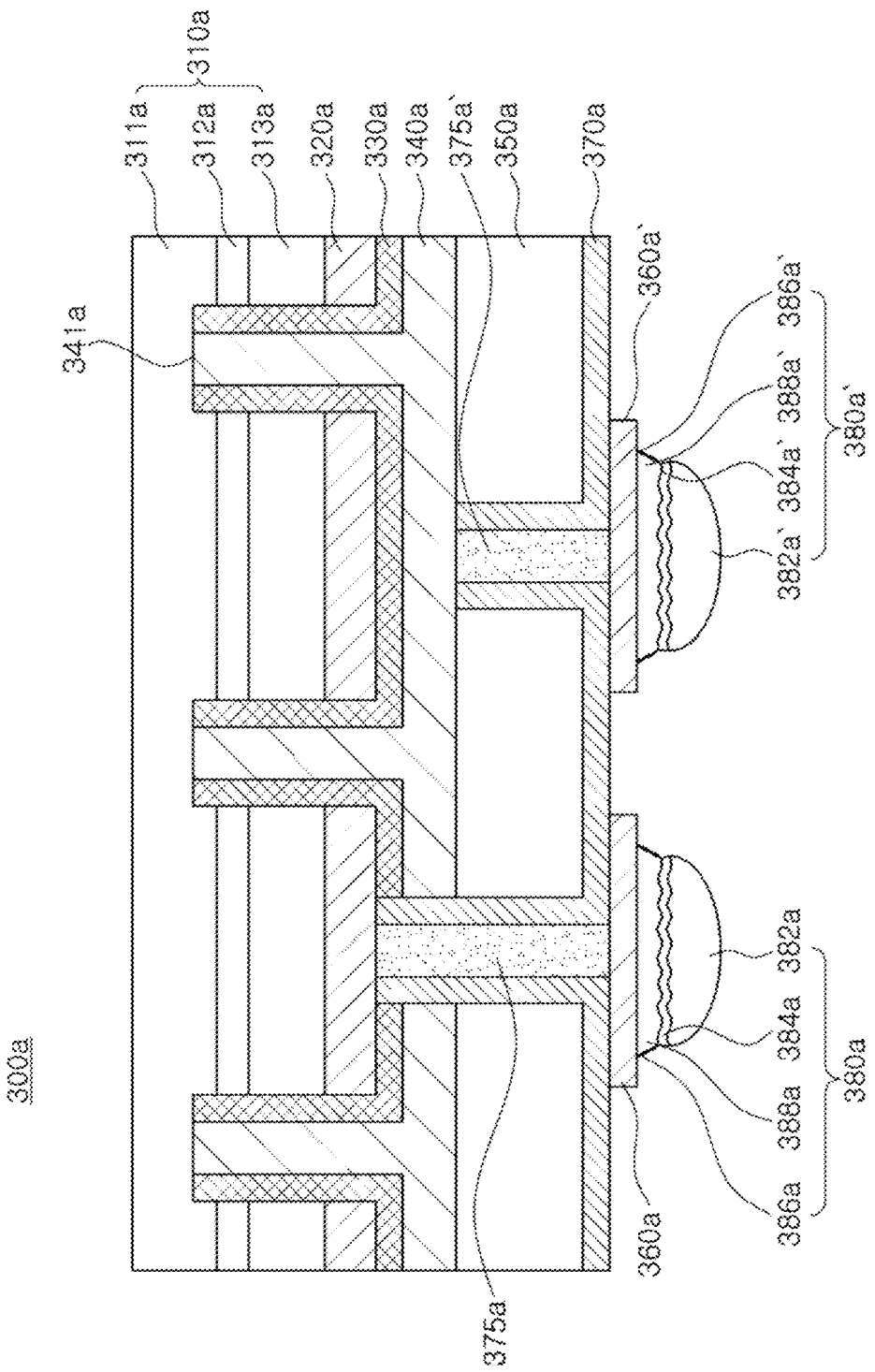
FIGS. 6 through 8 are cross-sectional views illustrating a semiconductor light emitting device according to an exemplary embodiment of the present inventive concept.

FIG. 6 is a cross-sectional view illustrating a semiconductor light emitting device according to an exemplary embodiment of the present inventive concept. Hereinafter, descriptions of components the same as those of the semiconductor light emitting device illustrated in FIGS. 2 through 3C will be omitted.

Referring to FIG. 6, a semiconductor light emitting device 300a according to an exemplary embodiment may be formed by sequentially stacking a first conductivity-type semiconductor layer 311a, an active layer 312a, a second conductivity-type semiconductor layer 313a, a second electrode layer 320a, a first electrode layer 340a, and a support substrate 350a. The first conductivity-type semiconductor layer 311a, the active layer 312a, and the second conductivity-type semiconductor layer 313a may form a light emitting laminate 310a. The first electrode layer 340a may include one or more contact holes 341a electrically connected to the first conductivity-type semiconductor layer 311a and extending from one surface of the first electrode layer 340a to at least part of the first conductivity-type semiconductor layer 311a. The first electrode layer 340a may be electrically insulated from the second electrode layer 320a, the second conductivity-type semiconductor layer 313a, and the active layer 312a by a first insulating layer 330a.

At least a portion of the first insulating layer 330a may be formed as multiple layers and serve to reflect light from the active layer 312a. The first insulating layer 330a may reflect light emitted from the active layer 312a in a downward direction to redirect it in an upward direction. The multilayered insulating layers may have a structure in which two types of insulating layers having different refractive indices are alternately stacked. By appropriately adjusting refractive indices and thicknesses of the insulating layers forming the multilayered insulating layers, the multilayered insulating layers may be provided as a distributed Bragg reflector (DBR).

When a wavelength of light generated by the active layer 312a is λ and a refractive index of each insulating layer is n, a thickness of each of multilayered insulating layers may be λ/4n. In detail, a thickness of each of the insulating layers may range from about 20 Å to 2000 Å. Here, a reflective index and a thickness of each of the insulating layers may be designed to obtain a high degree of reflectivity (70% or greater) with respect to a wavelength of light generated by the active layer 312a. For example, the thicknesses of the insulating layers may be the same or different.

The refractive index of each of the insulating layers may be determined within a range from about 1.1 to 2.5.

In the present exemplary embodiment, each of the insulating layers is repeatedly stacked two times to 40 times, thus forming the reflective structure.

The multilayered insulating layers may be formed of at least one of materials selected from the group consisting of $SiO_2$, SiN, $SiO_xN_y$, $TiO_2$, $Si_3N_4$, $Al_2O_3$, TiN, AlN, $ZrO_2$, TiAlN, and TiSiN, for example.

A second conductive via 375a may be formed to penetrate the first electrode layer 340a and the substrate 350a and electrically connect the second electrode layer 320a and a second electrode pad 360a formed on a lower surface of the second electrode layer 320a. Also, a first conductive via 375a' may be formed to penetrate the support substrate 350a and electrically connect the first electrode layer 340a and a first electrode pad 360a' formed on a lower surface of the first electrode layer 340a. In order to electrically insulate the second conductive via 375a from the first electrode layer 340a and the support substrate 350a and in order to electrically insulate the first conductive via 375a' from the support substrate 350a, a second insulating layer 370a may be formed to cover the lateral surfaces of the second conductive via 375a and the lateral surfaces of the first conductive via 375a', and may be formed to be connected along the lower surface of the support substrate 350a.

Interconnected bumps may be disposed below the first and second electrode pads 360a' and 360a. The interconnected bumps include a first bump 380a' and a second bump 380a and may be electrically connected to the first and second conductivity-type semiconductor layers 311a and 313a through the first and second conductive vias 375a' and 357a, respectively. The first and second bumps 380a and 380a' may be disposed to be oriented in the same direction in the semiconductor light emitting device 300a.

The first and second bumps 380a' and 380a may include under bump metallurgy (UBM) layers 388a and 388a', intermetallic compounds (IMC) 384a and 384a', and solder bumps 382a and 382a' sequentially disposed on lower surfaces of the first and second electrode pads 360a' and 360a, respectively. Also, the first and second bumps 380a' and 380a may include barrier layers 386a and 368a' formed on the lateral surfaces of the UBM layers 388a and 388a', respectively. The number of the first and the second bumps 380a' and 380a may be one or more, respectively.

The UBM layers 388a and 388a' may increase interface bonding strength between the first and second electrode pads 360a' and 360a and the solder bumps 382a and 382a', and provide an electrical path. Also, the UBM layers 388a and 388a' may prevent solder from being spread to the first and second electrode pads 360a' and 360a during a reflow process. Namely, the UBM layers 388a and 388a' may prevent a component of the solder from permeating into the first and second electrode pads 360a' and 360a.

The UBM layers 388a and 388a' may be formed of a metal for an electrical connection with the first and second electrode pads 360a' and 360a.

For example, the UBM layers 388a and 388a' may have a multilayer structure including a titanium (Ti) layer in contact with the first and second electrode pads 360a' and 360a and a nickel (Ni) layer disposed on the titanium (Ti) layer. Also, although not shown, the UBM layers 388a and 388a' may have a multilayer structure including a copper layer disposed on the titanium layer, instead of the nickel layer.

In the present exemplary embodiment, it is illustrated that the UBM layers 388a and 388a' have the multilayer structure of titanium (Ti) and nickel (Ni), but the structure of the UBM layers 388a and 388a' is not limited thereto. For example, the UBM layers 388a and 388a' may have a multilayer structure including a chromium (Cr) layer in contact with the first and second electrode pads 360a' and 360a and a nickel (Ni) layer disposed on the chromium layer or a multilayer structure including a chromium layer and a copper (Cu) layer disposed on the chromium layer.

Also, in the present exemplary embodiment, it is illustrated that the UBM layers 388a and 388a' have a multilayer structure, but the structure of the UBM layers 388a and 388a' is not limited thereto. For example, the UBM layers 388a and 388a' may have a monolayer structure including a nickel layer or a copper layer.

The UBM layers 388a and 388a' may be formed through a process such as sputtering, e-beam deposition, or plating.

The intermetallic compounds (IMC) 384a and 384a' may be formed on lower surfaces of the UBM layers 388a and 388a'. The intermetallic compounds (IMC) 384a and 384a' may be formed during a reflow process of forming the solder bumps 382a and 382a'. The intermetallic compounds (IMC) 384a and 384a' may be formed as the tin (Sn) component of the solder reacts with the metal, for example, nickel (Ni), of the UBM layers 388a and 388a', and may form a binary-system alloy of tin-nickel.

The solder bumps 382a and 382a' may be bonded with the UBM layers 388a and 388a' by the medium of the intermetallic compounds (IMC) 384a and 384a'. Namely, the solder bumps 382a and 382a' may be firmly bonded with the UBM layers 388a and 388a' by the means of the intermetallic compounds (IMC) 384a and 384a' serving as an adhesive.

The solder bumps 382a and 382a' may be formed by reflowing solder below the UBM layers 388a and 388a'. As the solder, for example, general SAC305 ($Sn_{96.5}Ag_{3.0}Cu_{0.5}$) may be used.

The barrier layers 386a and 386a' may be formed to cover the lateral surfaces of the UBM layers 388a and 388a'. The barrier layers 386a and 386a' may be gently sloped toward the first and second electrode pads 360a' and 360a from the intermetallic compounds (IMC) 384a and 384a'. Also, although not shown, the barrier layers 386a and 386a' may extend from lower surfaces of the first and second electrode pads 360a' and 360a perpendicularly.

The barrier layers 386a and 386a' may minimize wettability with respect to the solder bumps 382a and 382a', blocking spreading of the intermetallic compounds (IMC) 384a and 384a' and the solder bumps 382a and 382a' to the lateral surfaces of the UBM layers 388a and 388a'. This may be achieved by forming the barrier layers 386a and 386a' with a material having sufficiently minimized wettability with respect to the intermetallic compounds (IMC) 384a and 384a' and the solder bumps 382a and 382a. Thus, the intermetallic compounds (IMC) 384a and 384a' or the solder bumps 382a and 382a may not be formed on the barrier layers 386a and 386a'.

The barrier layers 386a and 386a' may be an oxide layer containing at least one of elements of the UBM layers 388a and 388a'. For example, the barrier layers 386a and 386a' may be an oxide layer containing at least one element among nickel (Ni) and copper (Cu).

The barrier layers 386a and 386a' may be formed by oxidizing the lateral surfaces of the UBM layers 388a and 388a', and in this case, the barrier layers 386a and 386a' may be formed by oxidizing the lateral surfaces of the UBM layers 388a and 388a' by performing, for example, thermal oxidation or plasma oxidation.

Figure 7:
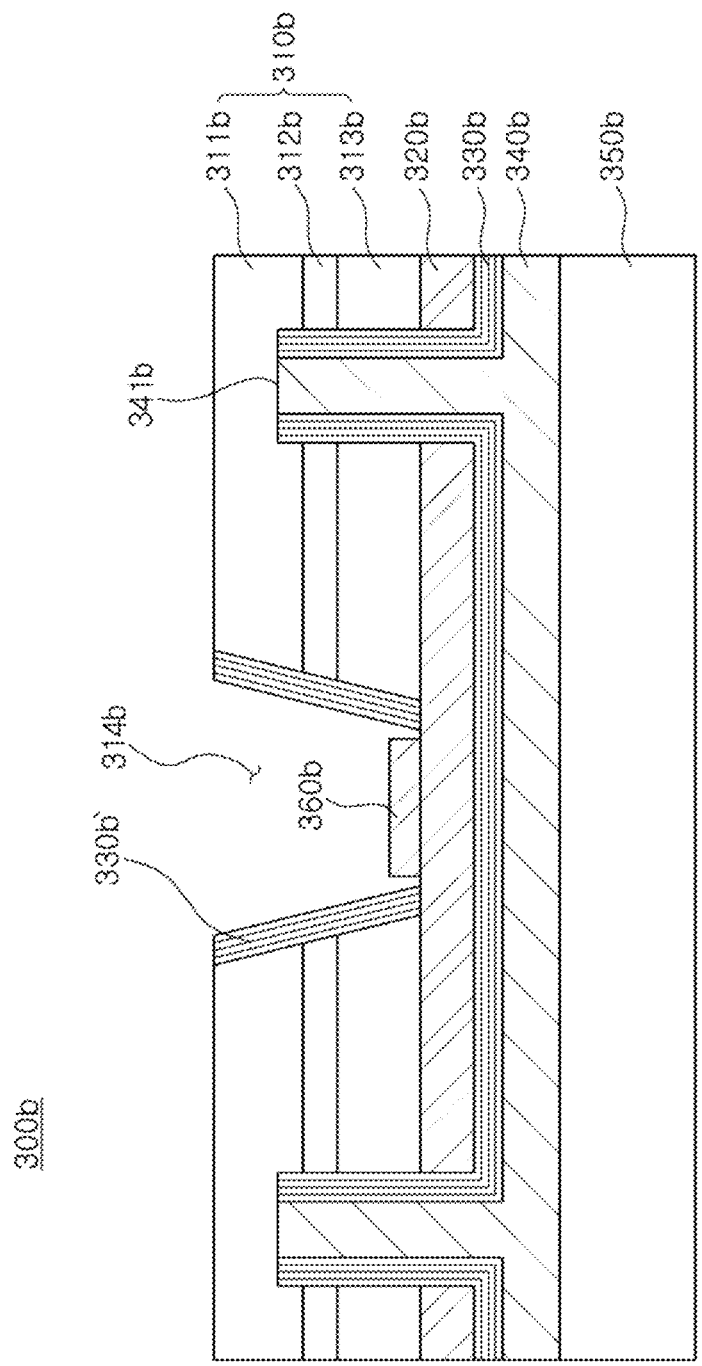

FIG. 7 is a cross-sectional view illustrating a semiconductor light emitting device according to an exemplary embodiment of the present inventive concept. Hereinafter, descriptions of components the same as those of the semiconductor light emitting device illustrated in FIGS. 2 through 3C will be omitted.

Referring to FIG. 7, a semiconductor light emitting device 300b according to an exemplary embodiment may be formed by sequentially stacking a first conductivity-type semiconductor layer 311b, an active layer 312b, a second conductivity-type semiconductor layer 313b, a second electrode layer 320b, a multilayered reflective structure 330b, a first electrode layer 340b, and a conductive substrate 350b. The first conductivity-type semiconductor layer 311b, the active layer 312b, and the second conductivity-type semiconductor layer 313b may form a light emitting laminate 310b. A via hole 314b may be formed on an upper surface of the second electrode layer 320b such that a portion of the upper surface of the second electrode 320b is exposed. An electrode pad unit 360b may be disposed in the exposed region of the second electrode layer 320b. The first electrode layer 340b may include one or more contact holes 341b electrically connected to the first conductivity-type semiconductor layer 311b, electrically insulated from the second conductivity-type semiconductor layer 313b and the active layer 312b, and extending from one surface of the first electrode layer 340b to at least part of the first conductivity-type semiconductor layer 311b. The second electrode layer 320b may be in direct contact with the second conductivity-type semiconductor layer 313b so as to be electrically connected.

The semiconductor light emitting device 300b may include: a first multilayer reflective structure 330b interposed between the first electrode layer 340b and the active layer 312b, more specifically interposed between the first electrode layer 340b and the second electrode layer 320b, and covering lateral surfaces of the contact holes 341b; and a second multilayer reflective structure 330b' covering lateral surfaces of the via hole 314b.

The first and second multilayer reflective structures 330b and 330b' reflect light emitted from the active layer 312b in a downward direction to redirect it in an upward direction. The first and second multilayer reflective structures 330b and 330b' may have a structure in which layers having different refractive indices are alternately stacked. In detail, the first and second multilayer reflective structures 330b and 330b' may be formed by alternately stacking two or more insulating layers having different refractive indices. By appropriately adjusting the refractive indices and thickness of the insulating layers constituting the first and second multilayer reflective structures 330b and 330b', the first and second multilayer reflective structures 330b and 330b' may be provided as distributed Bragg reflectors (DBR).

When a wavelength of light generated by the active layer 312b is λ and a refractive index of each insulating layer is n, a thickness of each of insulating layers forming the first and second multilayer reflective structures 330b and 330b' may be λ/4n. In detail, a thickness of each of the insulating layers may range from about 20 Å to 2000 Å. Here, a reflective index and a thickness of each of the insulating layers may be designed to obtain a high degree of reflectivity (70% or greater) with respect to a wavelength of light generated by the active layer 312b. For example, the thicknesses of the insulating layers may be the same or different.

The refractive index of each of the insulating layers may be determined within a range from about 1.1 to 2.5.

In the present exemplary embodiment, each of the insulating layers is repeatedly stacked two times to 40 times, thus forming the first and second multilayer reflective structures 330b and 330b'.

The first and second multilayer reflective structures 330b and 330b' may be formed of a material basically having insulating properties, and may be formed of an inorganic material or an organic material. The first and second multilayer reflective structures 330b and 330b' may include a silicon oxide or a silicon nitride having insulating properties, and may be formed of at least one of materials selected from the group consisting of $SiO_2$, $SiN$, $SiO_xN_y$, $TiO_2$, $Si_3N_4$, $Al_2O_3$, $TiN$, $AlN$, $ZrO_2$, $TiAlN$, and $TiSiN$, for example. Thus, the first and second multilayer reflective structures 330b and 330b' may insulate the first electrode layer 340b from the second electrode layer 320b, the second conductivity-type semiconductor layer 313b, and the active layer 312b.

Figure 8:
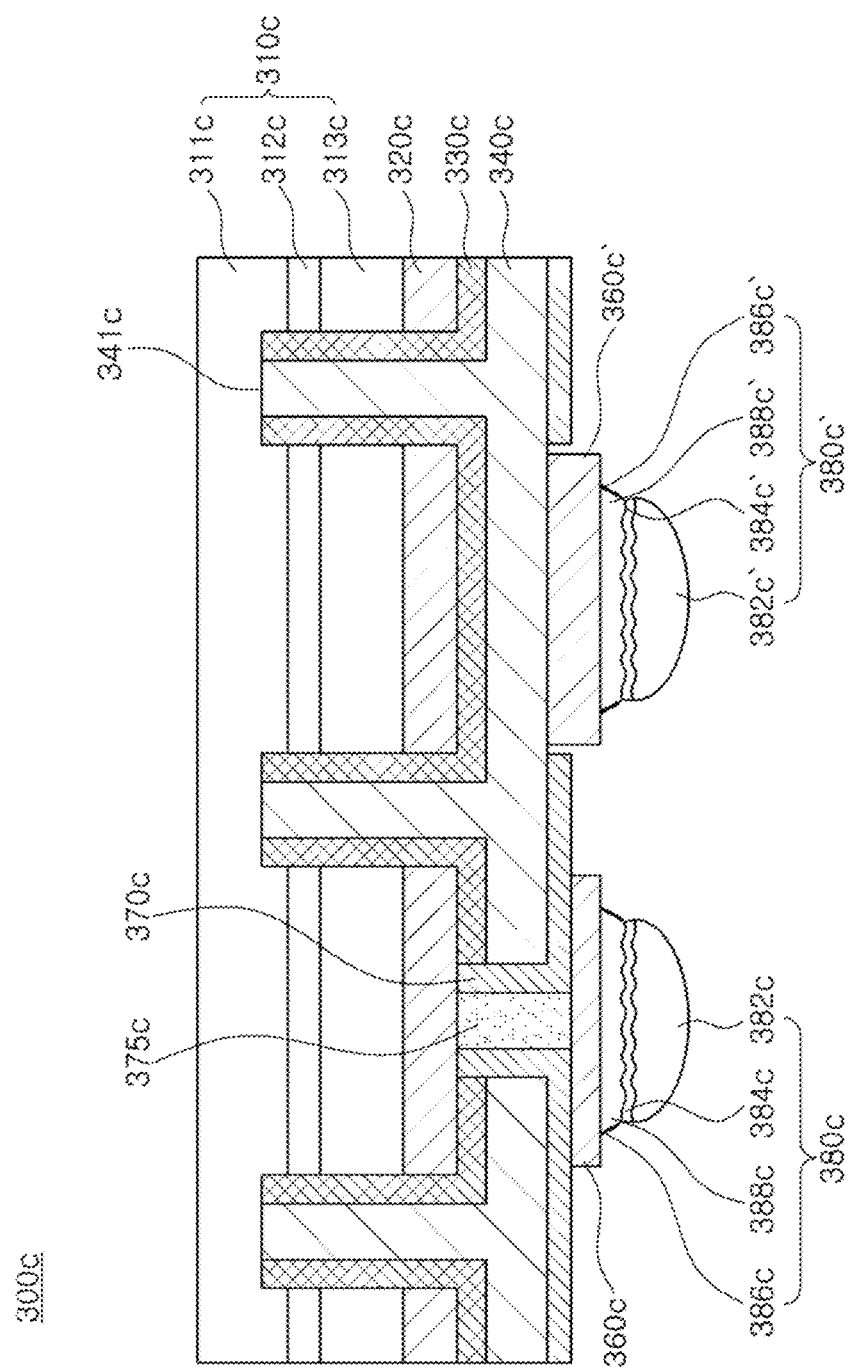

FIG. 8 is a cross-sectional view illustrating a semiconductor light emitting device according to an exemplary embodiment of the present inventive concept. Hereinafter, descriptions of components the same as those of the semiconductor light emitting device illustrated in FIGS. 2 through 3C and FIG. 6 will be omitted.

Referring to FIG. 8, a semiconductor light emitting device 300c according to an exemplary embodiment may be formed by sequentially stacking a first conductivity-type semiconductor layer 311c, an active layer 312c, a second conductivity-type semiconductor layer 313c, a second electrode layer 320c, and a first electrode layer 340c. The first conductivity-type semiconductor layer 311c, the active layer 312c, and the second conductivity-type semiconductor layer 313c may form a light emitting laminate 310c. The first electrode layer 340c may include one or more contact holes 341c electrically connected to the first conductivity-type semiconductor layer 311c and extending from one surface of the first electrode layer 340c to at least part of the first conductivity-type semiconductor layer 311c. The first electrode layer 340c may be electrically insulated from the second electrode layer 320c, the second conductivity-type semiconductor layer 313c, and the active layer 312c by a first insulating layer 330c.

A conductive via 375c may be formed to penetrate the first electrode layer 340c to electrically connect the second electrode layer 320c and a second electrode pad 360c formed on a lower surface of the second electrode layer 320c. Also, a first electrode pad 360c' may be formed on a lower surface of the first electrode layer 340c so as to be in direct contact with the first electrode layer 340c. In order to electrically insulate the conductive via 375c from the first electrode layer 340c, a second insulating layer 370c may be formed to cover the lateral surfaces of the conductive via 375c and a region of the lower surface of the first electrode layer 340c on which the first electrode pad 360c' is not disposed.

Interconnected bumps may be disposed below the first and second electrode pads 360c' and 360c. The interconnected bumps include a first bump 380c' and a second bump 380c and may be electrically connected to the first and second electrode pads 360c' and 360c, respectively. The first and second bumps 380c' and 380c' may be disposed to be oriented in the same direction in the semiconductor light emitting device 300c.

The first and second bumps 380c' and 380c may include under bump metallurgy (UBM) layers 388c and 388c', intermetallic compounds (IMC) 384c and 384c', and solder bumps 382c and 382c' sequentially disposed on lower surfaces of the first and second electrode pads 360c' and 360c, respectively. Also, the first and second bumps 380c' and 380c may include barrier layers 386c and 368c' formed on the lateral surfaces of the UBM layers 388c and 388c', respectively. The number of the first and the second bumps 380c' and 380c may be one or more, respectively.

The UBM layers 388c and 388c' may be formed of a metal for an electrical connection with the first and second electrode pads 360c' and 360c.

The intermetallic compounds (IMC) 384c and 384c' may be formed on lower surfaces of the UBM layers 388c and 388c'. The solder bumps 382c and 382c' may be bonded with the UBM layers 388c and 388c' by the medium of the intermetallic compounds (IMC) 384c and 384c'.

The solder bumps 382c and 382c' may be formed by reflowing solder below the UBM layers 388c and 388c'.

The barrier layers 386c and 386c' may be formed to cover the lateral surfaces of the UBM layers 388c and 388c'. The barrier layers 386c and 386c' may be gently sloped toward the first and second electrode pads 360c' and 360c from the intermetallic compounds (IMC) 384c and 384c'. Also, although not shown, the barrier layers 386c and 386c' may extend from lower surfaces of the first and second electrode pads 360c' and 360c perpendicularly.

Figure 9:
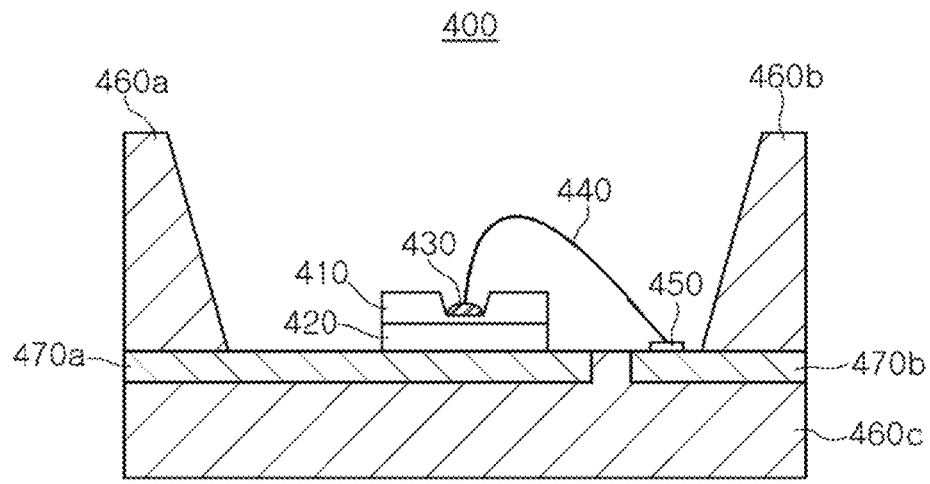
FIG. 9 is a cross-sectional view illustrating a semiconductor light emitting device package according to an exemplary embodiment of the present inventive concept.

FIG. 9 is cross-sectional view illustrating a semiconductor light emitting device package 400 according to an exemplary embodiment of the present inventive concept. The semiconductor light emitting device package 400 according to the present exemplary embodiment includes a semiconductor light emitting device package bodies 460a, 460b, and 460c; a first lead frame 470a and a second lead frame 470b installed in the semiconductor light emitting device package bodies 460a, 460b, and 460c and exposed to a lower surface of a recess portion 460c and spaced apart from one another by a predetermined distance; and semiconductor light emitting devices 410 and 420 mounted on the first lead frame 470a. The semiconductor light emitting devices 410 and 420 may be semiconductor light emitting devices according to an exemplary embodiment described above with reference to FIG. 1, and may have a via hole formed in a central portion thereof. Hereinafter, descriptions of the same components already described above will be omitted.

The semiconductor light emitting devices 410 and 420 include a light emitting unit 410 including first and second semiconductor layers, an active layer, and electrode layers, and a conductive substrate 420. The semiconductor light emitting devices 410 and 420 have a via hole formed on the light emitting unit 410 and further include an electrode pad unit 430 provided in the exposed region. The conductive substrate 420 is electrically connected to the first lead frame 470a, and the electrode pad unit 430 is electrically connected to the second lead frame 470b through a wire, or the like, on which a solder bump 450 is disposed.

Since the semiconductor light emitting devices 410 and 420 are electrically connected to the second lead frame 470b through wire bonding 440, they may guarantee maximum luminous efficiency while maintaining a vertical structure, and thereby they may be mounted as a mixed structure of die-bonding type and wire-bonding type. Thus, processes may be performed at relatively low costs.

Figure 10:
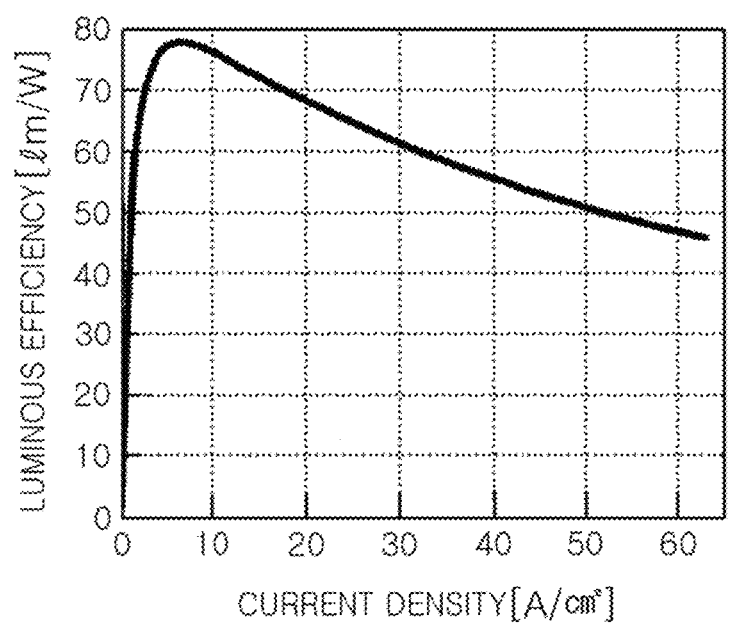
FIG. 10 is a graph illustrating luminous efficiency over current density of a light emitting surface.

FIG. 10 is a graph illustrating luminous efficiency over current density of a light emitting surface. Referring to the graph, once the current density exceeds about 10A/cm², luminous efficiency tends to increase as the current density decreases and tends to decrease as the current density increases.

Table 1 shows numerical values of such tendency together with light emitting area.

TABLE 1

| Light Emitting Area (cm²) | Current Density (A/cm²) | Luminous Efficiency (lm/W) | Enhancement Rate (%) |
|---|---|---|---|
| 0.0056 | 62.5 | 46.9 | 100 |
| 0.0070 | 50.0 | 51.5 | 110 |
| 0.0075 | 46.7 | 52.9 | 113 |
| 0.0080 | 43.8 | 54.1 | 115 |

Referring to FIG. 10 and Table 1, as a light emitting area increases, luminous efficiency increases. However, in order to secure a light emitting area, the area of distributed electrodes needs to be reduced, and thus, current density of a light emitting surface tends to be reduced. Such a reduction in current density in the light emitting surface may degrade electrical characteristics of the semiconductor light emitting device.

However, the foregoing problem may be solved by securing current spreading using contact holes. Thus, the problem in terms of electrical characteristics that may be generated due to the reduction in current density may be overcome through the method of forming contact holes, not extending to the light emitting surface but being formed inside the semiconductor light emitting device, and serving for current spreading. Thus, the semiconductor light emitting devices according to the present exemplary embodiment may obtain desirable luminous efficiency by securing a maximum light emitting area, while acquiring a desired degree of current spreading.

Figure 11:
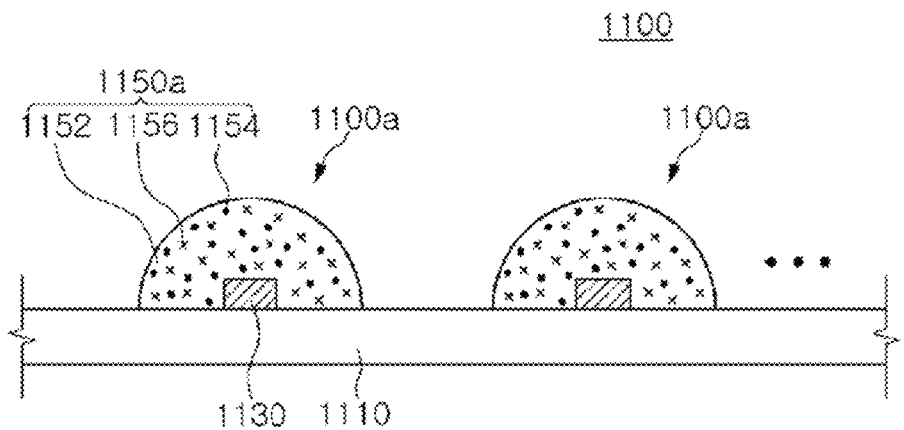
FIGS. 11 and 12 are cross-sectional views schematically illustrating a white light source module according to an exemplary embodiment of the present inventive concept.
Figure 12:
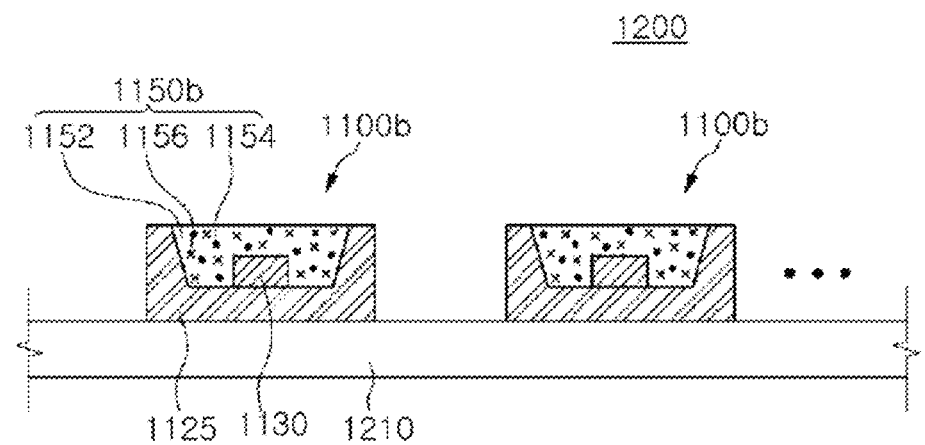

FIGS. 11 and 12 are cross-sectional views schematically illustrating a white light source module according to an exemplary embodiment of the present inventive concept.

Referring to FIG. 11, a light source module 1100 for an LCD backlight may include a circuit board 1110 and an array of a plurality of white light emitting apparatuses 1100a mounted on the circuit board 1110. A conductive pattern may be formed on an upper surface of the circuit board 1110 and connected to the white light emitting apparatuses 1100a.

Each of the white light emitting apparatuses 1100a may have a structure in which a light emitting device 1130 is directly mounted on the circuit board 1110 in a chip-on-board (COB) manner. Each of the white light emitting apparatuses 1100a does not have a reflective wall, and a wavelength conversion unit 1150a has a hemispherical shape having a lens function to provide a wide beam angle. Such a wide beam angle may contribute to reduction in a thickness or width of an LCD display. The wavelength conversion units 1150a and 1150b (please refer to FIG. 12) may include a resin 1152, a first phosphor 1154, and a second phosphor 1156.

Referring to FIG. 12, a light source module 1200 for an LCD backlight may include a circuit board 1210 and an array of a plurality of white light emitting apparatuses 1100b mounted on the circuit board 1210. Similar to the package illustrated in FIG. 11, each of the white light emitting apparatuses 1100b may include a light emitting device 1130 mounted in a reflective cup of a package body 1125 and emitting blue light and a wavelength conversion unit 1150b encapsulating the light emitting device 1130.

The first and second phosphors 1154 and 1156 are different wavelength conversion materials from each other. Details of the wavelength conversion material will be described hereinafter.

Figure 13:
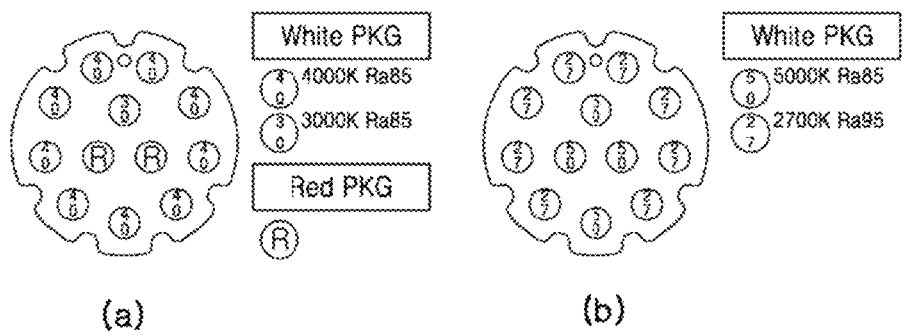
FIG. 13 is a view schematically illustrating a white light source module employable in a lighting device.

FIG. 13 is a view schematically illustrating a white light source module employable in a lighting device.

A light source module illustrated in FIG. 13 may include a plurality of light emitting device packages mounted on a circuit board. A plurality of light emitting device packages mounted on a single light source module may be configured as homogenous packages generating light having the same wavelength, or as in the present exemplary embodiment, a plurality of light emitting device packages mounted on a single light source module may be configured as heterogeneous packages generating light having different wavelengths.

Referring to (a) of FIG. 13, a white light source module may include a combination of white light emitting device packages and red light emitting device packages respectively having color temperatures of 4000K and 3000K. The white light source module may provide white light having a color temperature that may be adjusted to range from 3000K to 4000K and having a color rendering index (CRI) Ra ranging from 105 to 100.

Referring to (b) of FIG. 13, a white light source module includes only white light emitting device packages, and some of the packages may have white light having a different color temperature. For example, by combining a white light emitting device package having a color temperature of 2700K and a white light emitting device package having a color temperature of 5000K, white light having a color temperature that may be adjusted to range from 2700K to 5000K and having a CRI Ra of 85 to 99 may be provided. Here, the number of light emitting device packages having respective color temperature may vary depending on a reference set value of color temperature. For example, in case of a lighting device in which a reference set value of color temperature is about 4000K, the number of packages corresponding to 4000K may be greater than the number of red light emitting device packages corresponding to 3000K.

Like this, the light emitting device packages may be configured to include a light emitting device emitting white light by combining yellow, green, red, or orange phosphor with a blue light emitting device, and a purple, blue, green, red, or infrared light emitting device, and thereby a color temperature and CRI of white light may be adjusted.

Figure 26:
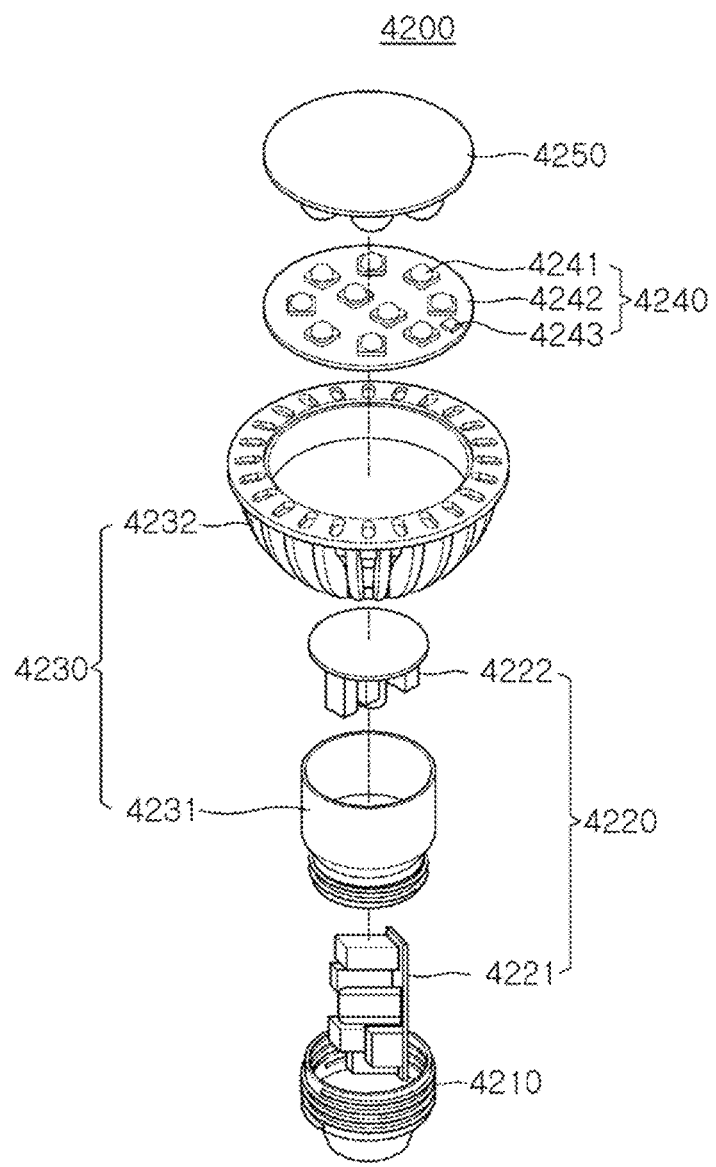
FIG. 26 is an exploded perspective view schematically illustrating a bulb type lamp as a lighting device according to an exemplary embodiment of the present inventive concept.
Figure 27:
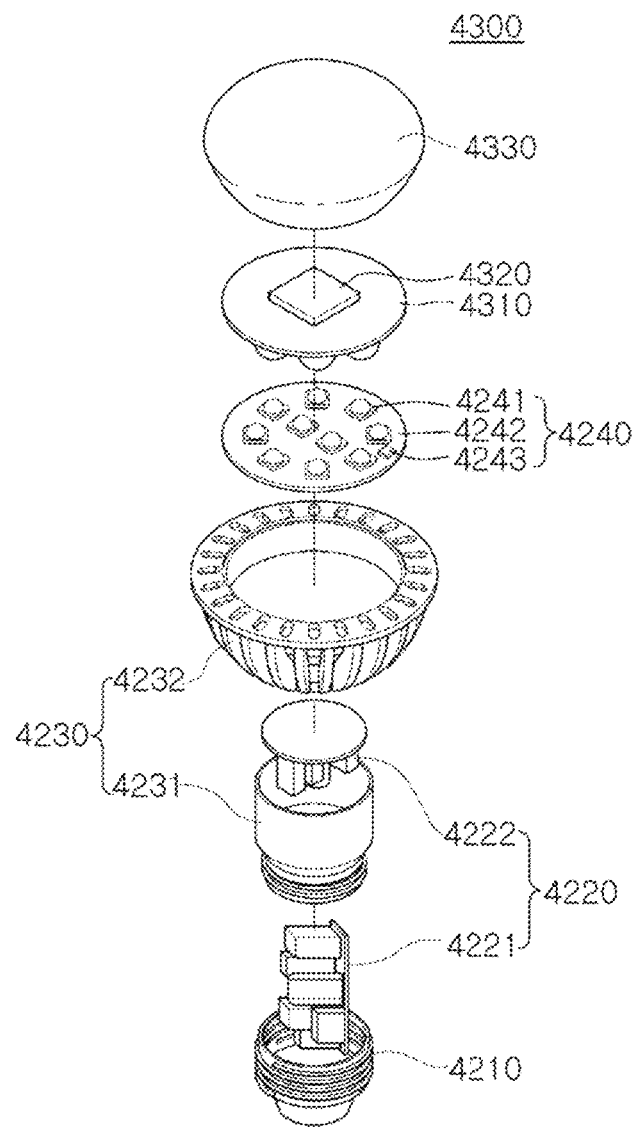
FIG. 27 is an exploded perspective view schematically illustrating a lamp including a communications module, as a lighting device, according to an exemplary embodiment of the present inventive concept.

The white light source module described above may be used as a light source module 4240 of a bulb-type lighting device ("4200" of FIG. 26 or "4300" of FIG. 27).

In a single light emitting device package, the color of light may be determined according to a wavelength of a light emitting device (LED chip), and types and mixing ratios of phosphors. When the desired color of light is white, a color temperature and a CRI thereof may be adjusted.

For example, when an LED chip emits blue light, a light emitting device package including at least one of yellow, green, and red phosphors may emit white light having various color temperatures according to mixing ratios of phosphors. In contrast, a light emitting device package in which a green or red phosphor is applied to a blue LED chip may emit green or red light. In this manner, a color temperature or a CRI of white light may be adjusted by combining a light emitting device package emitting white light and a light emitting device package emitting green or red light. Also, at least one of light emitting devices emitting purple, blue, green, red, or infrared light may be included.

In this case, the lighting device may control a color rendering index (CRI) ranging from the level of light emitted by a sodium lamp to the level of sunlight, and control a color temperature ranging from 1500K to 20000K to generate various levels of white light. If necessary, the lighting device may generate visible light having purple, blue, green, red, orange colors, or infrared light to adjust an illumination color according to a surrounding atmosphere or mood. Also, the lighting device may generate light having a special wavelength expediting plant growth.

Figure 14:
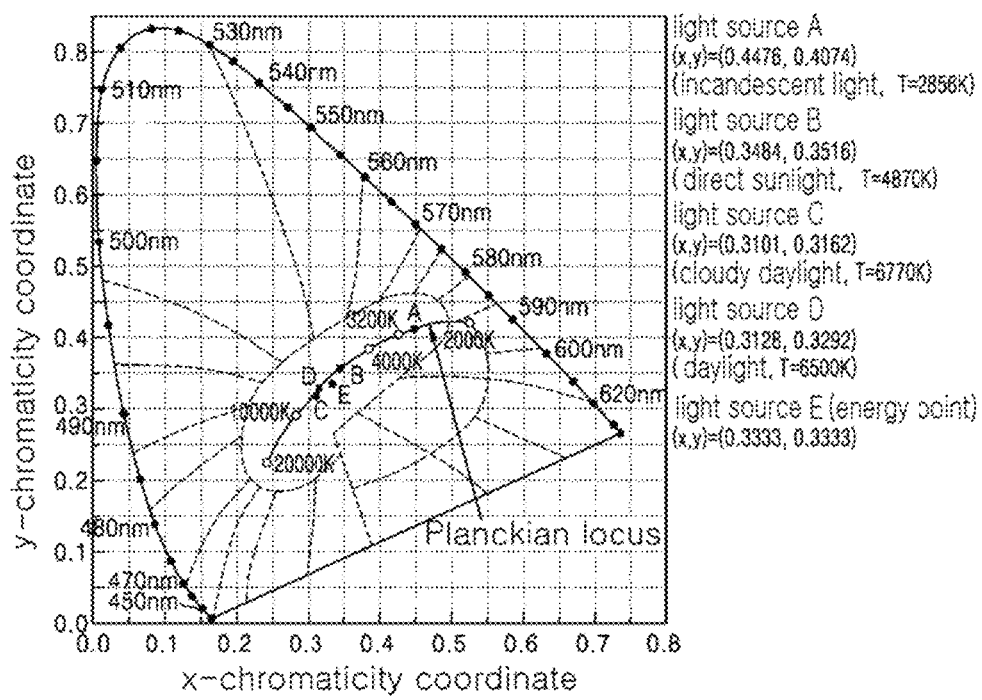
FIG. 14 is a CIE 1931 color space chromaticity diagram for explaining wavelength conversion materials that may be employed in a white light emitting device according to an exemplary embodiment of the present inventive concept.

FIG. 14 is a CIE 1931 color space chromaticity diagram illustrating wavelength conversion materials that may be employed in a white light emitting device according to an exemplary embodiment of the present inventive concept.

Referring to the CIE 1931 color space chromaticity diagram illustrated in FIG. 14, white light generated by combining yellow, green, and red phosphors with a UV or blue LED and/or green and red LEDs therewith, may have two or more peak wavelengths and (x,y) coordinates in the CIE 1931 color space chromativity may be positioned on the lines connecting coordinates (0.4476, 0.4074), (0.3484, 0.3516), (0.3101, 0.3162), (0.3128, 0.3292), (0.3333, 0.3333) of the CIE 1931 chromaticity diagram. Alternatively, it may be positioned in a region surrounded by a spectrum of black body radiation and the lines. A color temperature of white light corresponds to a range from about 2000K to about 20000K.

Various materials such as phosphors and/or quantum dots may be used as materials for converting a wavelength of light emitted from the semiconductor light emitting device.

Phosphors may have the following empirical formulas and colors:

Oxides: Yellow and green $Y_3Al_5O_{12}$:Ce, $Tb_3Al_5O_{12}$:Ce, $Lu_3Al_5O_{12}$:Ce Silicates: Yellow and green $(Ba,Sr)_2SiO_4$:Eu, yellow and orange $(Ba,Sr)_3SiO_5$:Ce Nitrides: Green β-SiAlON:Eu, yellow $La_3Si_6N_{11}$:Ce, orange α-SiAlON:Eu, red $CaAlSiN_3$:Eu, $Sr_2Si_5N_8$:Eu, $SrSiAl_4N_7$:Eu, $SrLiAl_3N_4$:Eu, $Ln_{4-x}(Eu_zM_{1-z})_xSi_{12-y}Al_yO_{3+x+y}N_{18-x-y}$ $(0.5 \leq x \leq 3, 0 < z < 0.3, 0 < y \leq 4)$    Equation (1)

In Equation (1), Ln may be at least one type of element selected from the group consisting of Group IIIa elements and rare earth elements, and M may be at least one type of element selected from the group consisting of calcium (Ca), barium (Ba), strontium (Sr), and magnesium (Mg).

Fluorides: KSF-based red $K_2SiF_6$:$Mn_4^+$, $K_2TiF_6$:$Mn_4^+$, $NaYF_4$:$Mn_4^+$, $NaGdF_4$:$Mn_4^+$ (For example, a composition ratio of Mn may be $0 < z \leq 0.17$).

Phosphor compositions should basically conform with stoichiometry, and respective elements may be substituted with different elements of respective groups of the periodic table. For example, strontium (Sr) may be substituted with barium (Ba), calcium (Ca), magnesium (Mg), and the like, of alkali earth metals, and yttrium (Y) may be substituted with terbium (Tb), lutetium (Lu), scandium (Sc), gadolinium (Gd), and the like. Also, europium (Eu), an activator, may be substituted with cerium (Ce), terbium (Tb), praseodymium (Pr), erbium (Er), ytterbium (Yb), and the like, according to a desired energy level, and an activator may be applied alone, or with a coactivator for changing characteristics of phosphors.

In particular, in order to enhance reliability at high temperatures and high humidity, the fluoride-based red phosphor may be coated with a fluoride not containing manganese (Mn) or with organic materials thereon. The organic materials may be coated on the fluoride-based red phosphor coated with a fluoride not containing manganese (Mn). Unlike any other phosphor, the fluoride-based red phosphor may realize a narrow full width at half maximum (FWHM) equal to or less than 40 nm, and thus, it may be utilized in high resolution TVs such as UHD TVs.

Table 2 below illustrates types of phosphors in applications fields of white light emitting devices using a blue LED chip (wavelength: 440 nm to 460 nm) or a UV LED chip (wavelength: 380 nm to 440 nm).

TABLE 2

| Purpose | Phosphor |
|---|---|
| LED TV BLU | β-SiAlON: $Eu^{2+}$, (Ca, Sr)AlSiN$_3$: $Eu^{2+}$, $La_3Si_6N_{11}$: $Ce^{3+}$, $K_2SiF_6$: $Mn^{4+}$, $SrLiAl_3N_4$: Eu, $Ln_{4-x}$ $(Eu_zM_{1-z})_xSi_{12-y}Al_yO_{3+x+y}N_{18-x-y}$ $(0.5 \leq x \leq 3, 0 < z < 0.3, 0 < y \leq 4)$, $K_2TiF_6$: $Mn^{4+}$, $NaYF_4$: $Mn^{4+}$, $NaGdF_4$: $Mn^{4+}$ |
| Lighting | $Lu_3Al_5O_{12}$: $Ce^{3+}$, Ca-α-SiAlON: $Eu^{2+}$, $La_3Si_6N_{11}$: $Ce^{3+}$, (Ca, Sr)AlSiN$_3$: $Eu^{2+}$, $Y_3Al_5O_{12}$: $Ce^{3+}$, $K_2SiF_6$: $Mn^{4+}$, $SrLiAl_3N_4$: Eu, $Ln_{4-x}$ $(Eu_zM_{1-z})_xSi_{12-y}Al_yO_{3+x+y}N_{18-x-y}$ $(0.5 \leq x \leq 3, 0 < z < 0.3, 0 < y \leq 4)$, $K_2TiF_6$: $Mn^{4+}$, $NaYF_4$: $Mn^{4+}$, $NaGdF_4$: $Mn^{4+}$ |
| Side Viewing (Mobile Device, Notebook) | $Lu_3Al_5O_{12}$: $Ce^{3+}$, Ca-α-SiAlON: $Eu^{2+}$, $La_3Si_6N_{11}$: $Ce^{3+}$, (Ca, Sr)AlSiN$_3$: $Eu^{2+}$, $Y_3Al_5O_{12}$: $Ce^{3+}$, (Sr, Ba, Ca, Mg)$_2SiO_4$: $Eu^{2+}$, $K_2SiF_6$: $Mn^{4+}$, $SrLiAl_3N_4$: Eu, $Ln_{4-x}$ $(Eu_zM_{1-z})_xSi_{12-y}Al_yO_{3+x+y}N_{18-x-y}$ $(0.5 \leq x \leq 3, 0 < z < 0.3, 0 < y \leq 4)$, $K_2TiF_6$: $Mn^{4+}$, $NaYF_4$: $Mn^{4+}$, $NaGdF_4$: $Mn^{4+}$ |
| Electrical component (Headlamp, etc.) | $Lu_3Al_5O_{12}$: $Ce^{3+}$, Ca-α-SiAlON: $Eu^{2+}$, $La_3Si_6N_{11}$: $Ce^{3+}$, (Ca, Sr)AlSiN$_3$: $Eu^{2+}$, $Y_3Al_5O_{12}$: $Ce^{3+}$, $K_2SiF_6$: $Mn^{4+}$, $SrLiAl_3N_4$: Eu, $Ln_{4-x}$ $(Eu_zM_{1-z})_xSi_{12-y}Al_yO_{3+x+y}N_{18-x-y}$ $(0.5 \leq x \leq 3, 0 < z < 0.3, 0 < y \leq 4)$, $K_2TiF_6$: $Mn^{4+}$, $NaYF_4$: $Mn^{4+}$, $NaGdF_4$: $Mn^{4+}$ |

Also, the wavelength conversion unit may be formed of wavelength conversion materials such as quantum dots (QD), and here, the quantum dots may be used in place of phosphors or may be mixed with phosphors.

Figure 15:
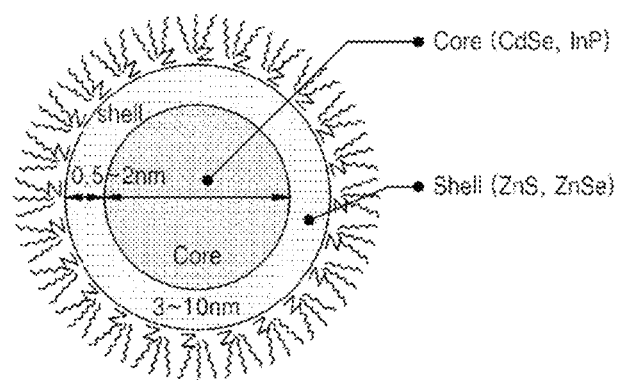
FIG. 15 is a schematic view illustrating a cross-sectional structure of a quantum dot.

FIG. 15 is a schematic view illustrating a cross-sectional structure of a quantum dot.

Referring to FIG. 15, a quantum dot (QD) may have a core-shell structure including Group II-VI or Group III-V compound semiconductors. For example, the quantum dot may have a core such as CdSe or InP or a shell such as ZnS or ZnSe. Also, the quantum dot may include a ligand to stabilize the core and shell. For example, the core may have a diameter ranging from 1 to 30 nm, preferably, 3 to 10 nm. The shell may have a thickness ranging from 0.1 to 20 nm, preferably, 0.5 to 2 nm.

The quantum dot may realize various colors according to sizes and, in particular, when the quantum dot is used as a phosphor substitute, it may be used as a red or green phosphor. The use of a quantum dot may realize a narrow FWHM (e.g., about 35 nm).

Figure 22:
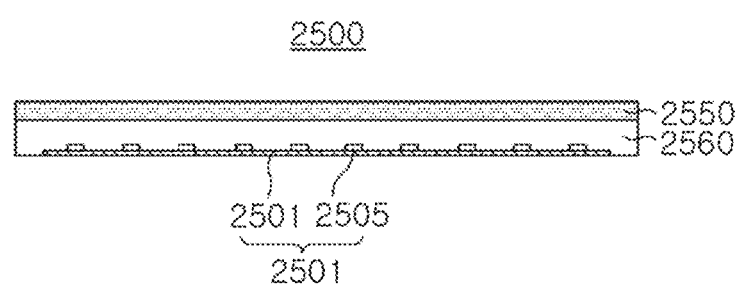
FIGS. 22, 23A, and 23B are cross-sectional views schematically illustrating backlight units according to various exemplary embodiments of the present inventive concept.
Figure 23A:
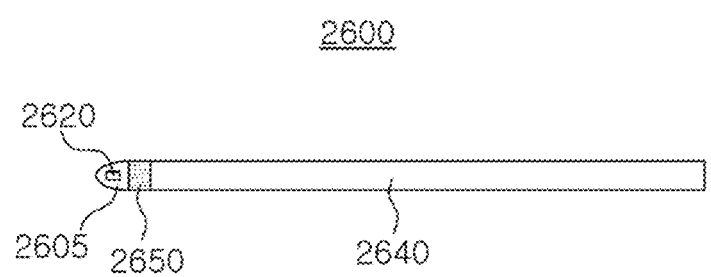
Figure 23B:
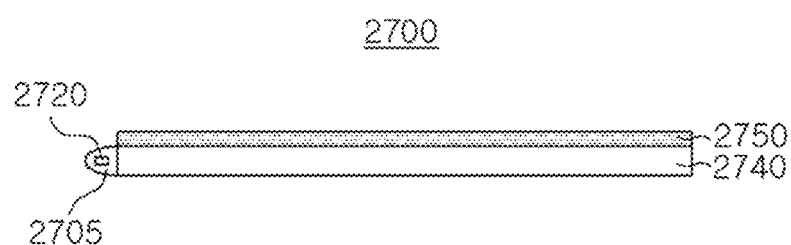

The wavelength conversion material may be realized in the form of being contained in an encapsulator (please refer to FIGS. 11 and 12), or alternatively, the wavelength conversion material may be manufactured as a film in advance and attached to a surface of an optical structure such as an LED chip or a light guide plate (please refer to FIGS. 22, 23A, and 23B). In this case, the wavelength conversion material having a uniform thickness may be easily applied to a desired region.

Figure 16:
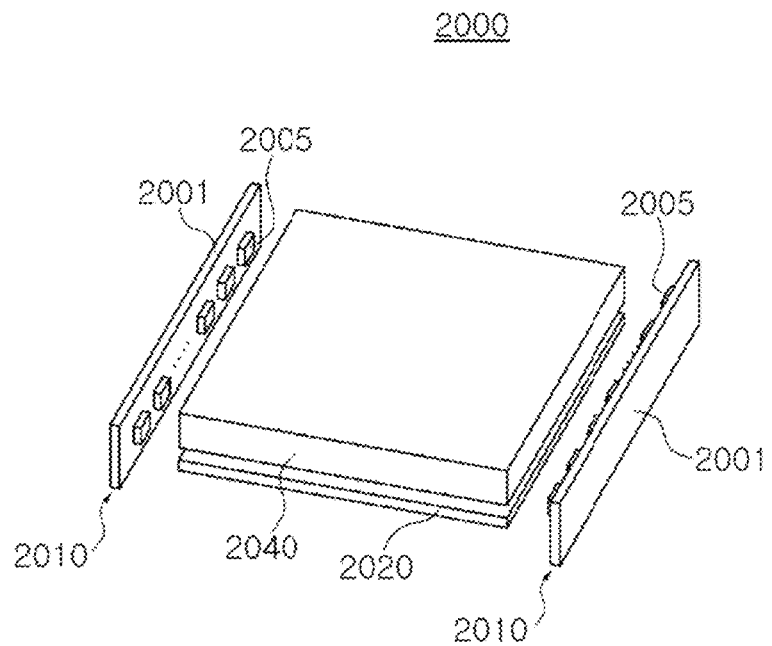
FIG. 16 is a perspective view schematically illustrating a backlight unit according to an exemplary embodiment of the present inventive concept.

FIG. 16 is a perspective view schematically illustrating a backlight unit according to an exemplary embodiment of the present inventive concept.

Referring to FIG. 16, a backlight unit 2000 may include a light guide plate 2040 and light source modules 2010 provided on both sides of the light guide plate 2040. Also, the backlight unit 2000 may further include a reflective plate 2020 disposed below the light guide plate 2040. The backlight unit 2000 according to the present exemplary embodiment may be an edge type backlight unit.

According to an exemplary embodiment, the light source module 2010 may be provided only on one side of the light guide plate 2040 or may further be provided on the other side thereof. The light source module 2010 may include a printed circuit board (PCB) 2001 and a plurality of light sources 2005 mounted on an upper surface of the PCB 2001.

Figure 17:
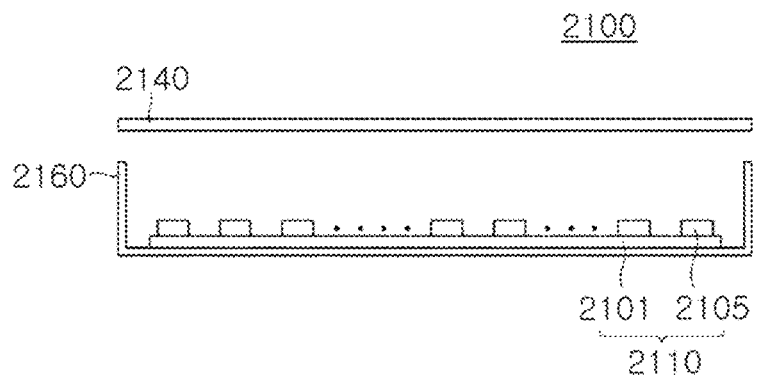
FIG. 17 is a view illustrating an embodiment of a direct type backlight unit.

FIG. 17 is a view illustrating an embodiment of a direct type backlight unit.

Referring to FIG. 17, a backlight unit 2010 may include a light diffuser 2140 and a light source module 2110 arranged below the light diffuser 2140. Also, the backlight unit 2100 may further include a bottom case 2160 disposed below the light diffuser 2140 and accommodating the light source module 2110. The backlight unit 2100 according to the present exemplary embodiment may be a direct type backlight unit.

The light source module 2110 may include a PCB 2101 and a plurality of light sources 2105 mounted on an upper surface of the PCB 2101.

Figure 18:
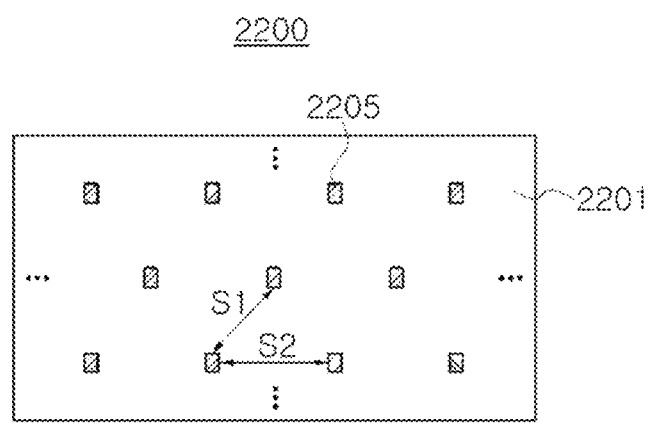
FIG. 18 is a view illustrating an example of disposition of light sources in the direct type backlight unit.

FIG. 18 is a view illustrating an example of disposition of light sources in the direct type backlight unit.

A direct type backlight unit 2200 according to the present exemplary embodiment may include a plurality of light sources 2205 arranged on a board 2201.

The arrangement structure of the light sources 2205 is a matrix structure in which the light sources 2205 are arranged in rows and columns, and here, the rows and columns have a zigzag form. This is a structure in which a second matrix having the same form as that of a first matrix is disposed within the first matrix in which the plurality of light sources 2205 are arranged rows and columns in straight lines, which may be understood as that each light source 2205 of the second matrix is positioned within a quadrangle formed by four adjacent light sources 2205 included in the first matrix.

However, in the direct type backlight unit, in order to enhance uniformity of brightness and light efficiency, if necessary, the first and second matrices may have different disposition structures and intervals. Also, in addition to the method of disposing the plurality of light sources, distances S1 and S2 between adjacent light sources may be optimized to secure uniformity of brightness.

Since the rows and columns of the light sources 2205 are disposed in a zigzag manner, rather than being disposed in straight lines, the number of light sources 2205 may be reduced by about 15% to 25% in comparison with a backlight unit having the same light emitting area.

Figure 19:
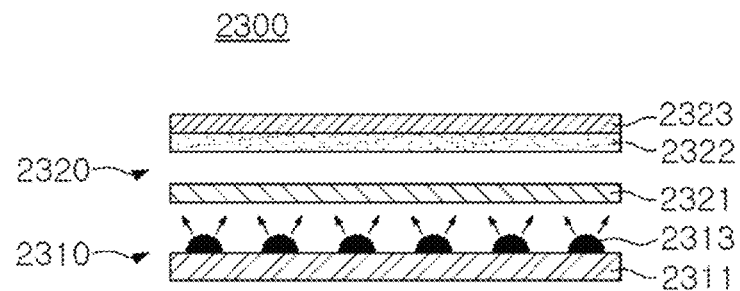
FIG. 19 is a view illustrating another embodiment of a direct type backlight unit.

FIG. 19 is a view illustrating another embodiment of a direct type backlight unit.

Referring to FIG. 19, a backlight unit 2300 according to the present exemplary embodiment may include an optical sheet 2320 and a light source module 2310 arranged below the optical sheet 2320.

The optical sheet 2320 may include a diffusion sheet 2321, a light collecting sheet 2322, a protective sheet 2323, and the like.

Figure 20:
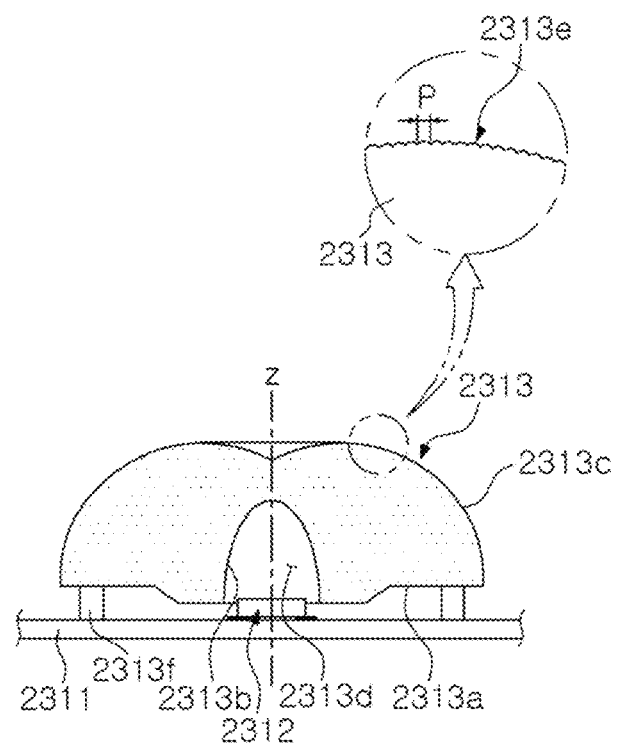
FIG. 20 is a view illustrating a light source module according to an exemplary embodiment of the present inventive concept.

The light source module 2310 may include a circuit board 2311, a plurality of light sources 2312 (refer to FIG. 20) mounted on the circuit board 2311, and a plurality of optical elements 2313 respectively disposed on the plurality of light sources 2312 (refer to FIG. 20). The light sources 2312 (refer to FIG. 20) may be the white light source module of FIG. 11 or 12.

The optical elements 2313 may adjust a beam angle of light through refraction, and in particular, a wide beam angle lens diffusing light from the light sources 2312 (refer to FIG. 20) to a wide region may be mainly used as the optical elements 2313. Since the light sources 2312 (refer to FIG. 20) with the optical elements 2313 attached thereto may have a wider light distribution, and thus, when the light source module is used in a backlight, planar lighting, and the like, the number of light sources 2312 (refer to FIG. 20) per unit area may be reduced.

FIG. 20 is a view illustrating a light source module according to an exemplary embodiment of the present inventive concept.

Referring to FIG. 20, the optical element 2313 may include a bottom surface 2313a disposed on the light source 2312, an incident surface 2313b to which light from the light source 2312 is incident, and an output surface 2313c from which light is emitted outwardly.

The bottom surface 2313a may have a recess portion 2313d formed in the center through which an optical axis Z passes, and depressed in a direction toward the output surface 2313c. A surface of the recess portion 2313d may be defined as the incident surface 2313b to which light from the light source 2312 is incident. That is, the incident surface 2313b may form the surface of the recess portion 2313d.

A central region of the bottom surface 2313a connected to the incident surface 2313b partially protrudes to the light source 2312, forming an overall non-flat structure. That is, unlike a general structure in which the entirety of the bottom surface 2313a is flat, the bottom surface 2313a has a structure in which portions thereof protrude along the circumference of the recess portion 2313d. A plurality of support portions 2313f may be provided on the bottom surface 2313a in order to fixedly support the optical element 2313 when the optical element 2313 is mounted on the circuit board 2311.

The output surface 2313c protrudes to have a dome shape in an upward direction (a light output direction) from the edge connected to the bottom surface 2313a, and the center of the output surface 2313c through which the optical axis Z passes is depressed to be concave toward the recess portion 2313d, having a point of inflection.

A plurality of ridges 2313e may be periodically arranged in a direction from the optical axis Z toward the edge. The horizontal cross-section of each of the plurality of ridges 2313e may be an annular shape, and form concentric circles centered on the optical axis Z. The plurality of ridges 2313e may be periodically arranged to spread out radially along the output surface 2313c from the optical axis Z.

The plurality of ridges 2313e may be spaced apart by a predetermined period (pitch) P so as to form patterns. In this case, the period P between the plurality of ridges 2313e may range from 0.01 mm to 0.04 mm. The plurality of ridges 2313e may offset performance gap of optical elements arising from a microscopic machining errors generated in a process of fabricating the optical elements 2313, thereby enhancing uniformity of light distribution.

Figure 21:
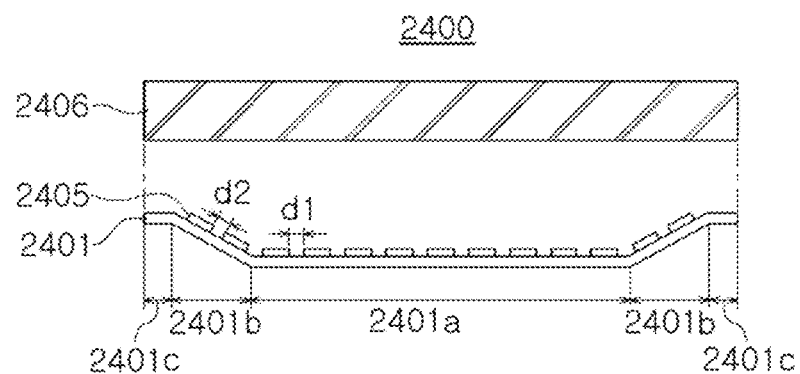
FIG. 21 is a view illustrating another embodiment of a direct type backlight unit.

FIG. 21 is a view illustrating another embodiment of a direct type backlight unit.

Referring to FIG. 21, a backlight unit 2400 includes at least one light source 2405 mounted on a circuit board 2401 and at least one optical sheet 2406 disposed thereabove.

The light source 2405 may be a white light emitting device containing a red phosphor according to an exemplary embodiment of the present inventive concept, and the module in which the light source 2405 is mounted on the circuit board 2401 may be the light source module illustrated in FIGS. 11 and 12.

The circuit board 2401 employed in the present exemplary embodiment may have a first planar portion 2401a corresponding to a main region, a sloped portion 2401b disposed around the first planar portion 2401a and bent in at least a portion thereto, and a second planar portion 2401c disposed on the edge of the circuit board 2501, namely, an outer side of the sloped portion 2401b.

The light sources 2405 are arranged at a first interval d1 on the first planar portion 2401a, and one or more light sources 2405 may be arranged at a second interval d2 on the sloped portion 2401b. The first interval d1 may be equal to the second interval d2. A width of the sloped portion 2401b (or a length in the cross-section) may be smaller than that of the first planar portion 2401a and may be larger than a width of the second planar portion 2401c. Also, if necessary, at least one light source 2405 may be arranged on the second planar portion 2401c.

A slope of the sloped portion 2401b may be appropriately adjusted within a range from 0 degree to 90 degrees with respect to the first planar portion 2401a, and with this structure, the circuit board 2401 may maintain uniform brightness even in the vicinity of the edge of the optical sheet 2406.

FIGS. 22, 23A, and 23B are cross-sectional views schematically illustrating backlight units according to various exemplary embodiments of the present inventive concept.

In backlight units 2500, 2600, and 2700 in FIGS. 22, 23A, and 23B, wavelength conversion units 2550, 2650, and 2750 are disposed outside of light sources 2505, 2605, and 2705, rather than being disposed in the light sources 2505, 2605, and 2705, to convert light, respectively.

Referring to FIG. 22, the backlight unit 2500 is a direct type backlight unit including the wavelength conversion unit 2550, a light source module 2510 arranged below the wavelength conversion unit 2550, and a bottom case 2560 accommodating the light source module 2510.

Also, the light source module 2510 may include a PCB 2501 and a plurality of light sources 2505 mounted on an upper surface of the PCB 2501. The light sources 2505 may have the same components as the light source module 1100 or 1200 of FIGS. 11 and 12 expet for a wavelength material.

In the backlight unit 2500 according to the present exemplary embodiment, the wavelength conversion unit 2550 may be disposed above the bottom case 2560. Thus, at least a partial amount of light emitted from the light source module 2510 may be wavelength-converted by the wavelength conversion unit 2550. The wavelength conversion unit 2550 may be manufactured as a separate film and applied to the backlight unit 2500 in a film form, or alternatively, the wavelength conversion unit 2550 may be integrally combined with a light diffuser (not shown) so as to be provided.

Referring to FIGS. 23A and 23B, backlight units 2600 and 2700 are edge type backlight units respectively including wavelength conversion units 2650 and 2750, light guide plates 2640 and 2740, and reflective units 2620 and 2720 and light sources 2605 and 2705 disposed on one side of the light guide plates 2640 and 2740.

Light emitted from the light sources 2605 and 2705 may be guided to the interior of the light guide plates 2640 and 2740 by the reflective units 2620 and 2720, respectively. In the backlight unit 2600 of FIG. 23A, the wavelength conversion unit 2650 may be disposed between the light guide plate 2640 and the light source 2605. In the backlight unit 2700 of FIG. 23B, the wavelength conversion unit 2750 may be disposed on a light emitting surface of the light guide plate 2740.

In FIGS. 22, 23A, and 23B, the wavelength conversion units 2550, 2650, and 2750 may include a general phosphor. In particular, in the case of using a quantum dot phosphor, the structures of wavelength conversion units 2550, 2650, and 2750 illustrated in FIGS. 22 through 23B may be utilized in the backlight units 2500, 2600, and 2700 in order to compensate for the vulnerability of the quantum dot phosphor to heat or moisture from a light source.

Figure 24:
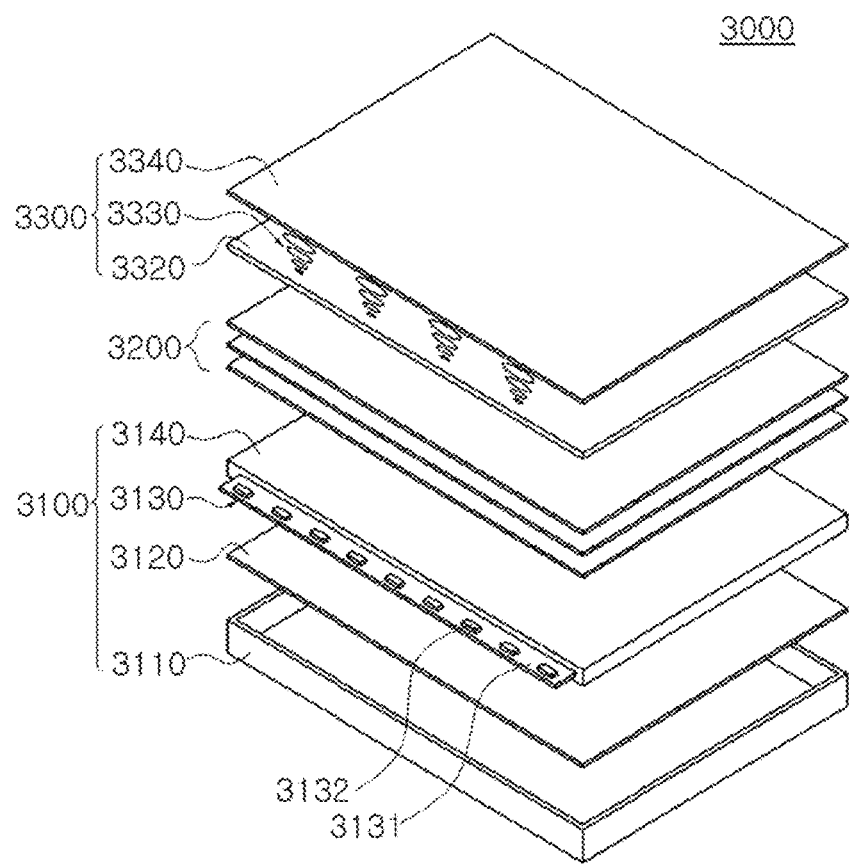
FIG. 24 is an exploded perspective view schematically illustrating a display apparatus according to an exemplary embodiment of the present inventive concept.

FIG. 24 is an exploded perspective view schematically illustrating a display apparatus according to an exemplary embodiment of the present inventive concept.

Referring to FIG. 24, a display apparatus 3000 may include a backlight unit 3100, an optical sheet 3200, and an image display panel 3300 such as a liquid crystal panel.

The backlight unit 3100 may include a bottom case 3110, a reflective plate 3120, a light guide plate 3140, and a light source module 3130 provided on at least one side of the light guide plate 3140. The light source module 3130 may include a PCB 3131 and light sources 3132. In particular, the light sources 3132 may be a side view type light emitting device mounted on the side portion adjacent to a light emitting surface.

The optical sheet 3200 may be disposed between the light guide plate 3140 and the image display panel 3300 and may include various types of sheets such as a diffusion sheet, a prism sheet, and a protective sheet.

The image display panel 3300 may display an image using light output from the optical sheet 3200. The image display panel 3300 may include an array substrate 3320, a liquid crystal layer 3330, and a color filter substrate 3340. The array substrate 3320 may include pixel electrodes disposed in a matrix form, thin film transistors (TFTs) applying a driving voltage to the pixel electrodes, and signal lines operating the TFTs. The color filter substrate 3340 may include a transparent substrate, a color filter, and a common electrode. The color filter may include filters allowing light having a particular wavelength, included in white light emitted from the backlight unit 3100, to selectively pass therethrough. Liquid crystals in the liquid crystal layer 3330 are rearranged by an electric field applied between the pixel electrodes and the common electrode, and thereby light transmittance is adjusted. The light with transmittance thereof adjusted may pass through the color filter of the color filter substrate 3340, thus display an image. The image display panel 3300 may further include a driving circuit unit processing an image signal, or the like.

The display apparatus 3000 according to the present exemplary embodiment uses the light sources 3132 emitting blue light, green light, and red light having a relatively small FWHM. Thus, emitted light, after passing through the color filter substrate 3340, may realize blue color, green color, and red color having a high level of color purity.

Figure 25:
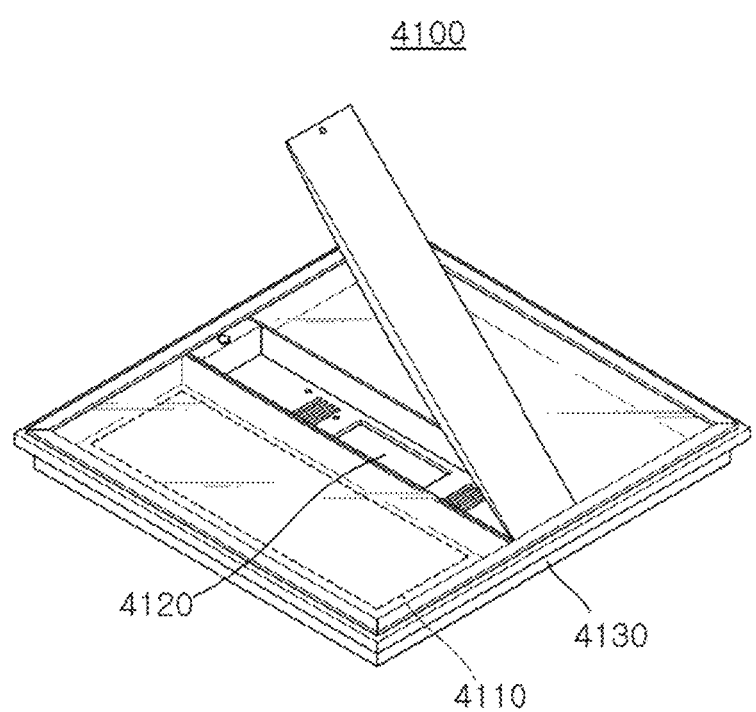
FIG. 25 is a perspective schematically illustrating a planar type lighting device according to an exemplary embodiment of the present inventive concept.

FIG. 25 is a perspective schematically illustrating a planar type lighting device according to an exemplary embodiment of the present inventive concept.

Referring to FIG. 25, a planar type lighting device 4100 may include a light source module 4110, a power supply device 4120, and a housing 4130. According to an exemplary embodiment of the present inventive concept, the light source module 4110 may include a light emitting device array, as a light source, and the power supply device 4120 may include a light emitting device driving unit.

The light source module 4110 may include a light emitting device array and may be formed to have an overall planar shape. According to an exemplary embodiment of the present inventive concept, the light emitting device array may include a light emitting device and a controller storing driving information of the light emitting device.

The power supply device 4120 may be configured to supply power to the light source module 4110. The housing 4130 may have an accommodation space accommodating the light source module 4110 and the power supply device 4120 therein and have a hexahedral shape with one side thereof opened, but the shape of the housing 4130 is not limited thereto. The light source module 4110 may be disposed to emit light to the opened one side of the housing 4130.

FIG. 26 is an exploded perspective view schematically illustrating a bulb type lamp as a lighting device according to an exemplary embodiment of the present inventive concept.

In detail, a lighting device 4200 may include a socket 4210, a power source unit 4220, a heat dissipation unit 4230, a light source module 4240, and an optical unit 4250. According to an exemplary embodiment of the present inventive concept, the light source module 4240 may include a light emitting device array, and the power source unit 4220 may include a light emitting device driving unit.

The socket 4210 may be configured to be replaced with an existing lighting device. Power supplied to the lighting device 4200 may be applied through the socket 4210. As illustrated, the power source unit 4220 may include a first power source unit 4221 and a second power source unit 4222. The first power source unit 4221 and the second power source unit 4222 may be assembled to form the power source unit 4220. The heat dissipation unit 4230 may include an internal heat dissipation unit 4231 and an external heat dissipation unit 4232. The internal heat dissipation unit 4231 may be directly connected to the light source module 4240 and/or the power source unit 4220 so as to transmit heat to the external heat dissipation unit 4232. The optical unit 4250 may include an internal optical unit (not shown) and an external optical unit (not shown) and may be configured to evenly distribute light emitted from the light source module 4240.

The light source module 4240 may emit light to the optical unit 4250 upon receiving power from the power source unit 4220. The light source module 4240 may include one or more light emitting devices 4241, a circuit board 4242, and a controller 4243. The controller 4243 may store driving information of the light emitting devices 4241.

FIG. 27 is an exploded perspective view schematically illustrating a lamp including a communications module, as a lighting device, according to an exemplary embodiment of the present inventive concept.

In detail, a lighting device 4300 according to the present exemplary embodiment is different from the lighting device 4200 illustrated in FIG. 26, in that a reflective plate 4310 is provided above the light source module 4240 and, here, the reflective plate 4310 serves to allow light from the light source to spread evenly in a direction toward the lateral side and back side thereof, and thereby glaring may be reduced.

A communications module 4320 may be mounted on an upper portion of the reflective plate 4310, and home network communication may be realized through the communications module 4320. For example, the communications module 4320 may be a wireless communications module using Zig-Bee™, Wi-Fi, or visible light communications (VLC) technology (or light fidelity (Li-Fi)), and control lighting installed within or outside of a household, such as turning on or off a lighting device, adjusting brightness of a lighting device, and the like, through a smartphone or a wireless controller. Also, home appliances or an automobile system within or outside of a household, such as a TV, a refrigerator, an air-conditioner, a door lock, or automobiles, and the like, may be controlled through a Li-Fi communications module using visible wavelengths of the lighting device installed within or outside of the household.

The reflective plate 4310 and the communications module 4320 may be covered by a cover unit 4330.

Figure 28:
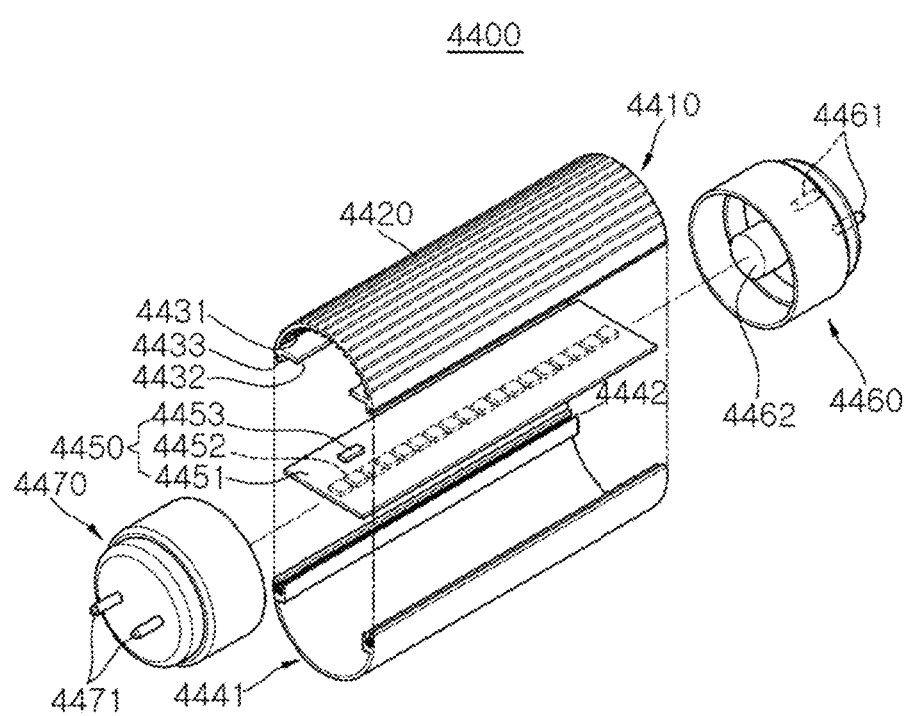
FIG. 28 is an exploded perspective view schematically illustrating a bar type lamp as a lighting device according to an exemplary embodiment of the present inventive concept.

FIG. 28 is an exploded perspective view schematically illustrating a bar type lamp as a lighting device according to an exemplary embodiment of the present inventive concept.

In detail, a lighting device 4440 includes a heat dissipation member 4410, a cover 4441, a light source module 4450, a first socket 4460, and a second socket 4470. A plurality of heat dissipation fins 4420 and 4431 may be formed in a concavo-convex pattern on an internal or/and external surface of the heat dissipation member 4410, and the heat dissipation fins 4420 and 4431 may be designed to have various shapes and intervals (spaces) therebetween. A support 4432 having a protrusion shape is formed on an inner side of the heat dissipation member 4410. The light source module 4450 may be fixed to the support 4432. Stoppage protrusions 4433 may be formed on both ends of the heat dissipation member 4410.

The stoppage recesses 4442 may be formed in the cover 4441, and the stoppage protrusions 4433 of the heat dissipation member 4410 may be coupled to the stoppage recesses 4442. The positions of the stoppage recesses 4442 and the stoppage protrusions 4433 may be interchanged.

The light source module 4450 may include a light emitting device array. The light source module 4450 may include a PCB 4451, a light source 4452, and a controller 4453. As described above, the controller 4453 may store driving information of the light source 4452. Circuit wirings are formed on the PCB 4451 to operate the light source 4452. Also, components for operating the light source 4452 may be provided.

The first and second sockets 4460 and 4470, a pair of sockets, are coupled to both ends of the cylindrical cover unit including the heat dissipation member 4410 and the cover 4441. For example, the first socket 4470 may include electrode terminals 4461 and a power source device 4462, and dummy terminals 4471 may be disposed on the second socket 4470. Also, an optical sensor and/or a communications module may be installed in either the first socket 4460 or the second socket 4470. For example, the optical sensor and/or the communications module may be installed in the second socket 4470 in which the dummy terminals 4471 are disposed. In another example, the optical sensor and/or the communications module may be installed in the first socket 4460 in which the electrode terminals 4461 are disposed.

Figure 29:
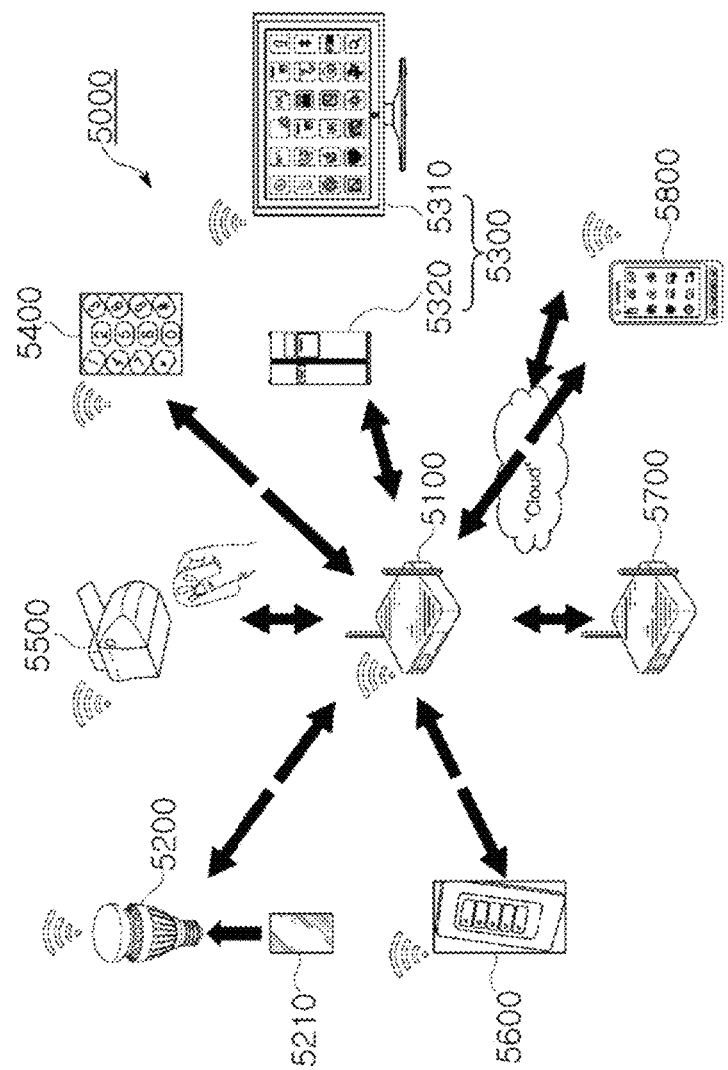
FIG. 29 is a view schematically illustrating an indoor lighting control network system.

FIG. 29 is a view schematically illustrating an indoor lighting control network system.

A network system 5000 may be a complex smart lighting-network system combining a lighting technology using a light emitting device such as an LED, or the like, Internet of things (IoT) technology, a wireless communications technology, and the like. The network system 5000 may be realized using various lighting devices and wired/wireless communications devices, and may be realized by a sensor, a controller, a communications unit, software for network control and maintenance, and the like.

The network system 5000 may be applied even to an open space such as a park or a street, as well as to a closed space such as a house or an office. The network system 5000 may be realized on the basis of the IoT environment in order to collect and process a variety of information and provide the same to users. Here, an LED lamp 5200 included in the network system 5000 may serve not only to receive information regarding a surrounding environment from a gateway 5100 and control lighting of the LED lamp 5200 itself, but also to check and control operational states of other devices 5300 to 5800 included in the IoT environment on the basis of a function such as visible light communications, or the like, of the LED lamp 5200.

Referring to FIG. 29, the network system 5000 may include the gateway 5100 processing data transmitted and received according to different communications protocols, the LED lamp 5200 connected to be available for communicating with the gateway 5100 and including an LED light emitting device, and a plurality of devices 5300 to 5800 connected to be available for communicating with the gateway 5100 according to various wireless communications schemes. In order to realize the network system 5000 on the basis of the IoT environment, each of the devices 5300 to 5800, as well as the LED lamp 5200, may include at least one communications module. In an exemplary embodiment, the LED lamp 5200 may be connected to be available for communicating with the gateway 5100 according to wireless communication protocols such as Wi-Fi, ZigBee™, or Li-Fi, and to this end, the LED lamp 5200 may include at least one communications module 5210 for a lamp.

As mentioned above, the network system 5000 may be applied even to an open space such as a park or a street, as well as to a closed space such as a house or an office. When the network system 5000 is applied to a house, the plurality of devices 5300 to 5800 included in the network system and connected to be available for communicating with the gateway 5100 on the basis of the IoT technology may include a home appliance 5300, a digital doorlock 5400, a garage doorlock 5500, a lighting switching 5600 installed on a wall, or the like, a router 5700 for relaying a wireless communication network, a mobile device 5800 such as a smartphone, a tablet, or a laptop computer.

In the network system 5000, the LED lamp 5200 may check operational states of various devices 5300 to 5800 using the wireless communications network (ZigBee™, Wi-Fi, LI-Fi, etc.) installed in a household or automatically control illumination of the LED lamp 5200 itself according to a surrounding environment or situation. Also, the devices 5300 to 5800 included in the network system 500 may be controlled using Li-Fi communications using visible light emitted from the LED lamp 5200.

First, the LED lamp 5200 may automatically adjust illumination of the LED lamp 5200 on the basis of information of a surrounding environment transmitted from the gateway 5100 through the communications module 5210 for a lamp or information of a surrounding environment collected from a sensor installed in the LED lamp 5200. For example, brightness of illumination of the LED lamp 5200 may be automatically adjusted according to types of programs broadcast in the TV 5310 or brightness of a screen. To this end, the LED lamp 5200 may receive operation information of the TV 5310 from the communications module 5210 for a lamp connected to the gateway 5100. The communications module 5210 for a lamp may be integrally modularized with a sensor and/or a controller included in the LED lamp 5200.

For example, when a program value broadcast in a TV program is a human drama, a color temperature of illumination may be decreased to be 12000K or lower, for example, to 5000K, and a color tone may be adjusted according to preset values, and thereby a cozy atmosphere is presented. Conversely, when a program value is a comedy program, the network system 5000 may be configured such that a color temperature of illumination is increased to 5000K or higher according to a preset value and illumination is adjusted to white illumination based on a blue color.

Also, when there is no person in a house, and a predetermined time has lapsed after digital doorlock 5400 is locked, all of turned-on LED lamps 5200 are turned off to prevent a waste of electricity. Also, when a security mode is set through the mobile device 5800, or the like, and the digital doorlock 5400 is locked with no person in a house, the LED lamp 5200 may be maintained in a turned-on state.

An operation of the LED lamp 5200 may be controlled according to surrounding environments collected through various sensors connected to the network system 5000. For example, when the network system 5000 is realized in a building, a lighting, a position sensor, and a communications module are combined in the building, and position information of people in the building is collected and the lighting is turned on or turned off, or the collected information may be provided in real time to effectively manage facilities or effectively utilize an idle space. In general, a lighting device such as the LED lamp 5200 is disposed in almost every space of each floor of a building, and thus, various types of information of the building may be collected through a sensor integrally provided with the LED lamp 5200 and used for managing facilities and utilizing an idle space.

The LED lamp 5200 may be combined with an image sensor, a storage device, and the communications module 5210 for a lamp, so as to be utilized as a device for maintaining building security, or sensing and coping with an emergency situation. For example, when a sensor of smoke or temperature, or the like, is attached to the LED lamp 5200, a fire may be promptly sensed to minimize damage. Also, brightness of lighting may be adjusted in consideration of a weather outside or an amount of sunshine, thereby saving energy and providing an agreeable illumination environment.

As described above, the network system 5000 may also be applied to an open space such as a street or a park, as well as to a closed space such as a house, an office, or a building. When the network system 5000 is intended to be applied to an open space without a physical limitation, it may be difficult to realize the network system 5000 due to a limitation in a distance of wireless communications, communications interference due to various obstacles. In this case, a sensor, a communications module, and the like, may be installed in each lighting fixture, and each lighting fixture may be used as an information collecting means or a communications relay means, whereby the network system 5000 may be more effectively realized in an open environment. This will be described with reference to FIG. 30 hereinafter.

Figure 30:
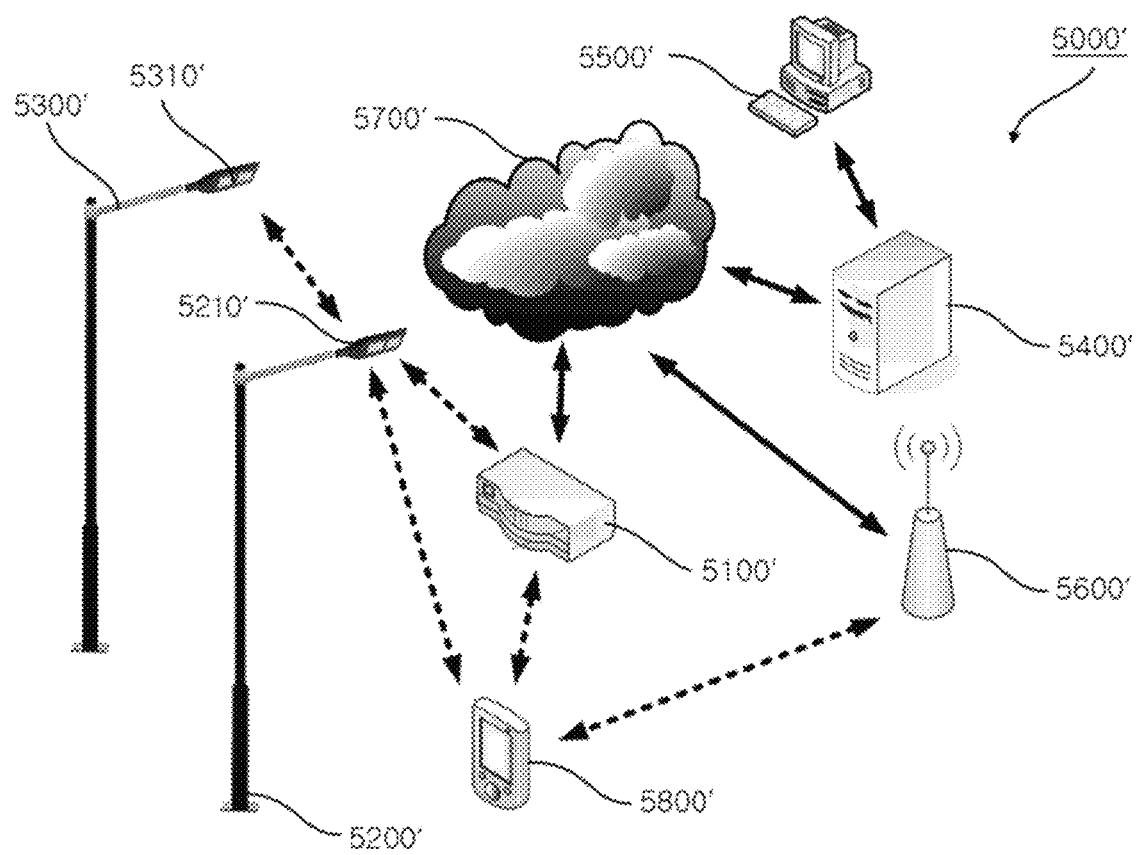
FIG. 30 is a view illustrating an embodiment of a network system applied to an open space.

FIG. 30 is a view illustrating an embodiment of a network system 5000' applied to an open space.

Referring to FIG. 30, a network system 5000' according to the present exemplary embodiment may include a communications connection device 5100', a plurality of lighting fixtures 5200' and 5300' installed at every predetermined interval and connected to be available for communicating with the communications connection device 5100', a server 5400', a computer 5500' managing the server 5400', a communications base station 5600', a communications network 5700', a mobile device 5800', and the like.

Each of the plurality of lighting fixtures 5200' and 5300' installed in an open outer space such as a street or a park may include smart engines 5210' and 5310', respectively. The smart engines 5210' and 5310' may include a light emitting device, a driver of the light emitting device, a sensor collecting information of a surrounding environment, a communications module, and the like. The smart engines 5210' and 5310' may communicate with other neighboring equipment by means of the communications module according to communications protocols such as Wi-Fi, ZigBee™, and Li-Fi.

For example, one smart engine 5210' may be connected to communicate with another smart engine 5310'. Here, a Wi-Fi extending technique (Wi-Fi mesh) may be applied to communications between the smart engines 5210' and 5310'. The at least one smart engine 5210' may be connected to the communication connection device 5100' connected to the communications network 5700' by wired/wireless communications. In order to increase communication efficiency, some smart engines 5210' and 5310' may be grouped and connected to the single communications connection device 5100'.

The communications connection device 5100' may be an access point (AP) available for wired/wireless communications, which may relay communications between the communications network 5700' and other equipment. The communications connection device 5100' may be connected to the communications network 5700' in either a wired manner or a wireless manner, and for example, the communications connection device 5100' may be mechanically received in any one of the lighting fixtures 5200' and 5300'.

The communications connection device 5100' may be connected to the mobile device 5800' through a communication protocol such as Wi-Fi, or the like. A user of the mobile device 5800' may receive surrounding environment information collected by the plurality of smart engines 5210' and 5310' through the communications connection device 5100' connected to the smart engine 5210' of the lighting fixture 5200' adjacent to the mobile device 5800'. The surrounding environment information may include nearby traffic information, weather information, and the like. The mobile device 5800' may be connected to the communications network 5700' according to a wireless cellular communications scheme such as 3G or 4G through the communications base station 5600'.

Meanwhile, the server 5400' connected to the communications network 5700' may receive information collected by the smart engines 5210' and 5310' respectively installed in the lighting fixtures 5200' and 5300' and monitor an operational state, or the like, of each of the lighting fixtures 5200' and 5300'. In order to manage the lighting fixtures 5200' and 5300' on the basis of the monitoring results of the operational states of the lighting fixtures 5200' and 5300', the server 5400' may be connected to the computer 5500' providing a management system. The computer 5500' may execute software, or the like, capable of monitoring and managing operational states of the lighting fixtures 5200' and 5300', specifically, the smart engines 5210' and 5310'.

Figure 31:
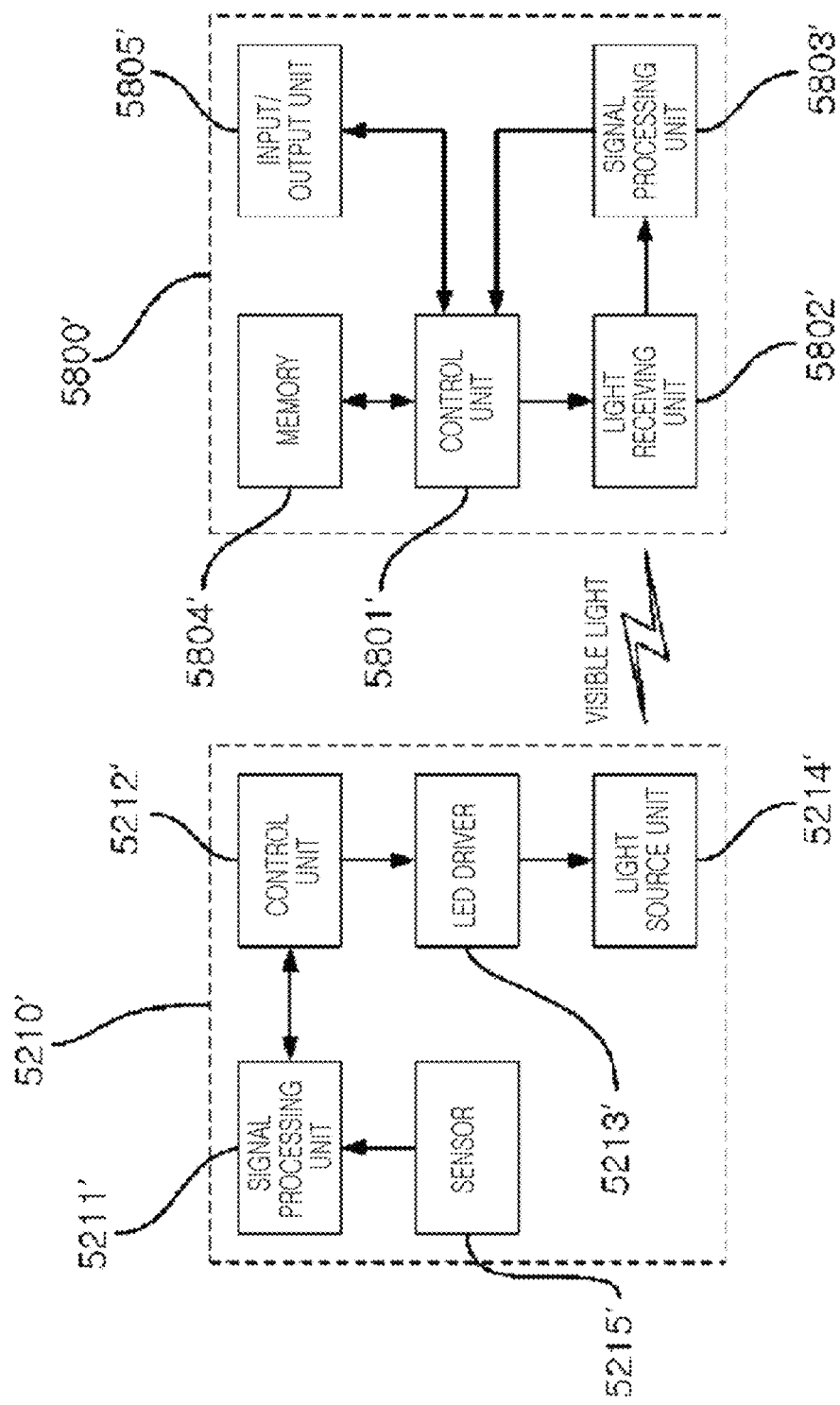
FIG. 31 is a block diagram illustrating a communications operation between a smart engine of a lighting fixture and a mobile device according to visible light communications (VLC) (or light fidelity (Li-Fi))

In order to transmit information collected by the smart engines 5210' and 5310' to the mobile device 5800' of the user, various communications schemes may be applied. Referring to FIG. 31, information collected by the smart engines 5210' and 5310' may be transmitted to the mobile device 5800' through the communications connection device 5100' connected to the smart engines 5210' and 5310', or the smart engines 5210' and 5310' and the mobile device 5800' may be connected to directly communicate with each other. The smart engines 5210' and 5310' and the mobile device 5800' may directly communicate with each other by visible light communications (Li-Fi). This will be described with reference to FIG. 31 hereinafter.

FIG. 31 is a block diagram illustrating a communications operation between the smart engine 5210' of the lighting fixture 5200' (please refer to FIG. 30) and the mobile device 5800' according to visible light communications.

Referring to FIG. 31, the smart engine 5210' may include a signal processing unit 5211', a control unit 5212', an LED driver 5213', a light source unit 5214', a sensor 5215', and the like. The mobile device 5800' connected to the smart engine 5210' by visible light communications may include a control unit 5801', a light receiving unit 5802', a signal processing unit 5803', a memory 5804', an input/output unit 5805', and the like.

The visible light communications (VLC) technology (or light fidelity (Li-Fi)) is a wireless communications technology transferring information wirelessly by using light having a visible light wavelength band recognizable by the naked eye. The visible light communications technology is distinguished from the existing wired optical communications technology and the infrared data association (IrDA) in that it uses light having a visible light wavelength band, namely, a particular visible light frequency from the light emitting device package according to the exemplary embodiment described above and is distinguished from the existing wired optical communications technology in that a communications environment is based on a wireless scheme.

Also, unlike RF wireless communications, the VLC technology (or Li-Fi) has excellent convenience because it can be used without being regulated or authorized in the aspect of frequency usage, and VLC technology (or Li-Fi) has distinction of having excellent physical security and a user's verification of communication link with his or her own eyes. Most of all, VLC technology (or Li-Fi) is differentiated in that it has features as a convergence technology that obtains both a unique purpose as a light source and a communications function.

The signal processing unit 5211' of the smart engine 5210' may process data intended to be transmitted and received by VLC. In an exemplary embodiment, the signal processing unit 5211' may process information collected by the sensor 5215' into data and transmit the processed data to the control unit 5212'. The control unit 5212' may control operations of the signal processing unit 5211', the LED driver 5213', and the like, and in particular, the control unit 5212' may control an operation of the LED driver 5213' on the basis of data transmitted from the signal processing unit 5211'. The LED driver 5213' emits the light source unit 5214' according to a control signal transmitted from the control unit 5212', thereby transmitting data to the mobile device 5800'

The mobile device 5800' may include the light receiving unit 5802' for recognizing visible light including data, in addition to the control unit 5801', the memory 5804' storing data, the input/output unit 5805' including a display, a touch screen, an audio output unit, and the like, and the signal processing unit 5803'. The light receiving unit 5802' may sense visible light and convert the sensed visible light into an electrical signal, and the signal processing unit 5803' may decode data included in the electrical signal converted by the light receiving unit 5802'. The control unit 5801' may store the data decoded by the signal processing unit 5803' in the memory 5804' or may output the decoded data through the input/output unit 5805' to allow the user to recognize the data.

Sapphire is commonly used as a material of a substrate to form a nitride-based semiconductor device. However, a sapphire substrate is so expensive and hard that it is difficult to manufacture a chip therefrom. A sapphire has low electrical conductivity. Also, when a sapphire substrate having a large diameter is epitaxially grown, the substrate is bowed at high temperatures due to low heat conductivity, and thus, it is difficult to manufacture a sapphire substrate with a large area. In order to overcome such a limitation, a nitride-based semiconductor device utilizing a silicon substrate, instead of a sapphire substrate, has been developed. A silicon substrate has high heat conductivity, relative to a sapphire substrate, and thus, a degree of bowing of the silicon substrate is not high even at high temperatures at which a nitride thin film is grown and a thin film having a large diameter may be grown. However, when a nitride thin film is grown on a silicon substrate, dislocation density may be increased due to a lattice constant mismatch between the substrate and the thin film and cracks may be generated due to a difference in coefficients of thermal expansion. Thus, a method for reducing the dislocation density and a method for preventing cracks have been actively researched. However, when dislocation density is reduced, tensile stress may be generated concomitantly, and thereby dislocation density may be reduced but a generation of cracks may increase, or conversely, cracks may be reduced but dislocation density may increase. Namely, when a nitride thin film is grown on a silicon substrate, it is difficult to satisfy both a reduction in dislocation density and a reduction in cracks.

FIGS. 32A through 32E are cross-sectional views illustrating processes of an example of a method for manufacturing a semiconductor device according to an exemplary embodiment of the present inventive concept.

Figure 32A:
FIGS. 32A through 32E are cross-sectional views illustrating processes of an example of a method for manufacturing a semiconductor device according to an exemplary embodiment of the present inventive concept.
Figure 32B:
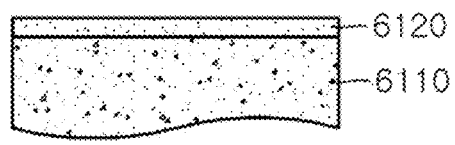
Figure 32C:
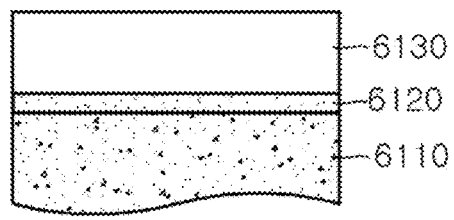
Figure 32D:
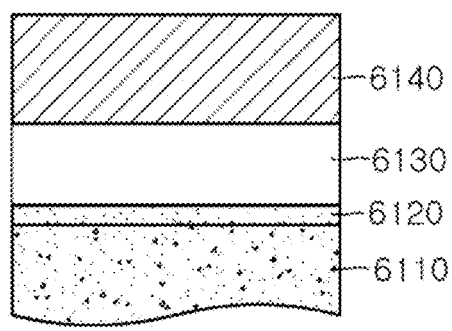
Figure 32E:
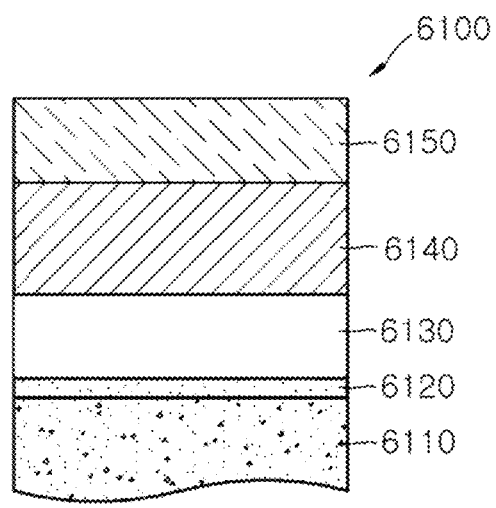

The method for manufacturing a semiconductor device according to an exemplary embodiment may include a step of preparing a substrate (FIG. 32A), a step of forming a buffer layer (FIGS. 32B to 32D), and a step of forming device layer (FIG. 32E). The step of preparing a substrate may include preparing a doped substrate and masking a marginal portion of a substrate. The step of forming a buffer layer may include forming a nucleation layer (FIG. 32B), forming a first buffer layer (FIG. 32C), and forming a second buffer layer (FIG. 32D). The step of forming a device layer (FIG. 32E) may be performed in the substantially same manner regardless of substrate types. With a completed epitaxial wafer, a step of manufacturing a chip is performed. The step of manufacturing a chip includes a mesa etching and forming an electrode. Chips having various structures such as a vertical structure, a horizontal structure, a vertical/horizontal structure, a flipchip structure, and the like, may be manufactured during the step of manufacturing a chip. The step of manufacturing a chip may be substantially the same regardless of substrate types. However, in a case of manufacturing a semiconductor device using a silicon substrate, the silicon substrate may be eliminated or a reflective structure may be formed during epitaxial growth, since the silicon substrate absorbs light.

First, a silicon substrate 6110 or 6110' (refer to FIG. 33A) for single crystal growth of a nitride semiconductor are prepared. The silicon substrate 6110 may be a silicon substrate doped with a high concentration of an impurity. As the impurity, boron (B), aluminum (Al), magnesium (Mg), calcium (Ca), zinc (Zn), cadmium (Cd), hydrogyrum (Hg), gallium (Ga), germanium (Ge), and the like, may be used. As the silicon substrate 6110, a silicon substrate or a silicon carbide (SiC) substrate may be used. As the silicon substrate, for example, (111) plane may be used.

A doping concentration of the silicon substrate 6110 may range from about $5 \times 10^{17}/cm^3$ to $10^{20}/cm^3$ or may range from about $10^{18}/cm^3$ to $5 \times 10^{19}/cm^3$. If the doping concentration is lower than $5 \times 10^{17}/cm^3$, it is difficult to obtain a bow reduction effect, and if the doping concentration exceeds $10^{20}/cm^3$, it is difficult to form a silicon substrate in a single crystal form. Alternatively, the doping concentration may be determined such that resistivity of the silicon substrate 6110 is about 1 Ωcm or less.

(Embodiment A1)

As illustrated in FIG. 32A, the silicon substrate 6110 doped with a high concentration of an impurityn is prepared. The silicon substrate 6110 is manufactured by doping an impurity therein. For example, when a silicon ingot is grown, impurity doping may be performed together to form the silicon substrate 6110.

(Embodiment A2)

Figure 33A:
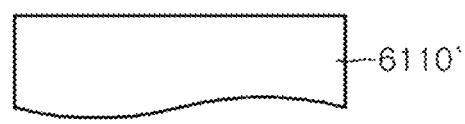
FIGS. 33A and 33B are cross-sectional views illustrating processes of an example of a method for manufacturing a semiconductor device according to an exemplary embodiment of the present inventive concept.
Figure 33B:
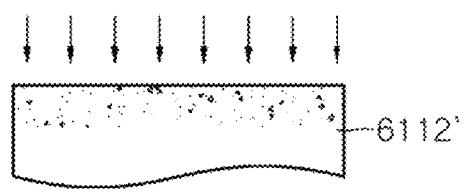

As illustrated in FIG. 33A, a general silicon substrate 6110', which is not doped with an impurity or doped with a low concentration of an impurity is prepared. Next, the silicon substrate 6110' may be doped with a high concentration of an impurity by using an ion implantation process. Through the process, a silicon substrate 6112' in which a high concentration of an impurity is distributed to a region close to the surface for growth may be formed as illustrated in FIG. 33B.

In the embodiments described above, the silicon substrate 6110 doped with a high concentration of an impurity is employed in order to reduce bowing of the substrate generated during the manufacturing process of the semiconductor device 6110 and, here, a degree of bowing generally appears as bow measured in a wafer level. In the semiconductor device 6100 according to the embodiment, bow of the silicon substrates 6110 and 6112' may be about 100 um or less with respect to a point 1" from the center of the wafer.

Since the silicon substrate 6110 doped with an impurity having a level equal to or higher than a predetermined level is used during the foregoing manufacturing process, plastic deformation of the substrate rarely occurs even after a process in which a high temperature and stress are applied, whereby high quality of thin film with reduced bow can be obtained. Also, the manufactured semiconductor device 6100 may be used as a template for manufacturing various high quality light emitting devices or power devices.

Figure 34:
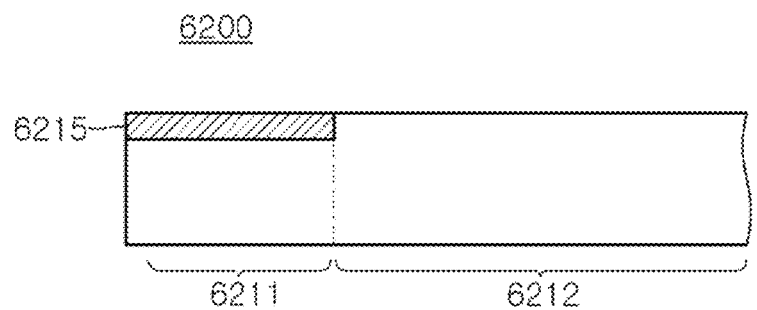
FIGS. 34 through 37 are views illustrating a silicon substrate to which the method for manufacturing a semiconduc-

Next, a nitride semiconductor layer 6200 on the silicon substrate illustrated in FIG. 34 includes a crack preventing portion 6215. The nitride semiconductor layer 6200 on the silicon substrate includes a silicon main portion 6212 and a silicon edge portion 6211 present on the circumference of the silicon main portion 6212. The silicon substrate may have, for example, a circular shape, and the silicon main portion 6212 may represent an inner portion of the edge portion 6211 of the substrate. Also, the silicon main portion 6212 may represent a region in which a single crystal nitride semiconductor thin film is to be grown. The silicon substrate may have the crack preventing unit 6215 formed on an upper surface of the silicon edge portion 6211, and here, a direction of a crystal plane of the crack preventing portion 6215 may be random.

The silicon main portion 6212 may have a (111) crystal plane and the crack preventing portion 6215 may have an irregular crystal plane, for example. Since the crack preventing portion 6215 is formed such that a direction of a crystal plane thereof is irregular, when a nitride semiconductor thin film is grown thereon, the nitride semiconductor thin film may be formed to be amorphous or polycrystalline, rather than being grown as a single crystal. Meanwhile, the nitride semiconductor thin film may be grown as a single crystal on the silicon main portion 6212.

When the crack preventing portion 6215 has a crystal plane in a random direction or has a rough surface, for example, the nitride semiconductor thin film may be oriented in the (111) direction in the silicon main portion 6212, or randomly oriented in the surface crystal direction due to the rough surface in the crack preventing portion 6215 during the process of growing the nitride semiconductor thin film. Thus, since the nitride semiconductor thin film grown on the surface of the crack preventing portion 6215 is grown in a polycrystalline or amorphous state, stress in the interface between the substrate and the thin film may be alleviated due to the growth of the heterogeneous materials, unlike the single crystal portion of the nitride semiconductor thin film grown on the (111) plane of the silicon substrate. Thus, when the nitride semiconductor thin film is grown on the silicon edge portion 6211, stress due to the thin film may be reduced, and thereby deformation of the silicon substrate may be alleviated.

(Embodiment B1)

Figure 35A:
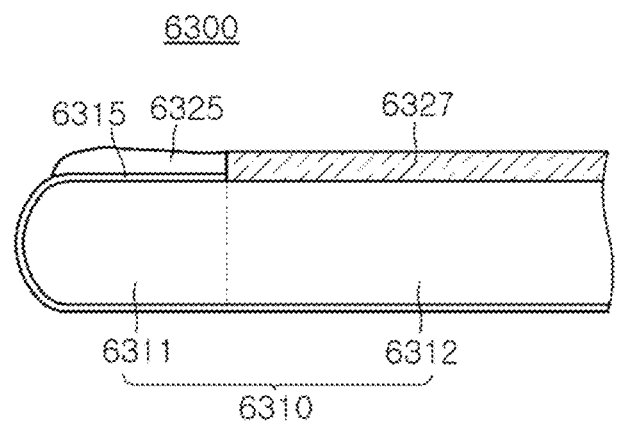

A crack preventing portion 6315 of a nitride semiconductor layer 6300 may be formed as an oxide layer on a substrate illustrated in FIG. 35A. First, the crack preventing portion 6315 may be formed as a thermal oxide on an edge region 6311 by thermal oxidation. Alternatively, a dielectric material such as an oxide or a nitride is deposited on a silicon substrate 6310 including the edge region 6311 and the main region 6312 through chemical vapor deposition (CVD) or sputtering. The crack preventing portion 6315 comprised of dielectric material may be formed thereafter by patterning and etching through photolithography, such that the dielectric material remains only in the edge region 6311. Alternatively, the dielectric material may be patterned and etched such that the dielectric material is left only in the edge region 6311 through a photolithography process, and then the dielectric material in the internal region of the edge region 6311 may be removed by a lift-off method, and thereby the crack preventing portion 6315 may be formed. Here, the crack preventing portion 6315 may also be formed on a lateral surface of the silicon substrate 6310, as well as on the upper portion of the edge region 6311. Alternatively, the crack preventing portion 6315 may also be formed such that it may extend along the lateral surface and bottom surface of the silicon substrate 6310, as well as along the upper portion of the edge region 6311.

A nitride semiconductor thin film 6325 grown on the crack preventing portion 6315 may be grown in a polycrystalline or amorphous state, and thereby stress due to lattice constant mismatch in the interface may be alleviated. However, a nitride semiconductor thin film 6327 grown in the main region 6312 is formed such that a crystal on a surface thereof is oriented in a (111) direction, and thus, stress due to lattice constant mismatch is not alleviated.

(Embodiment B2)

Figure 35B:
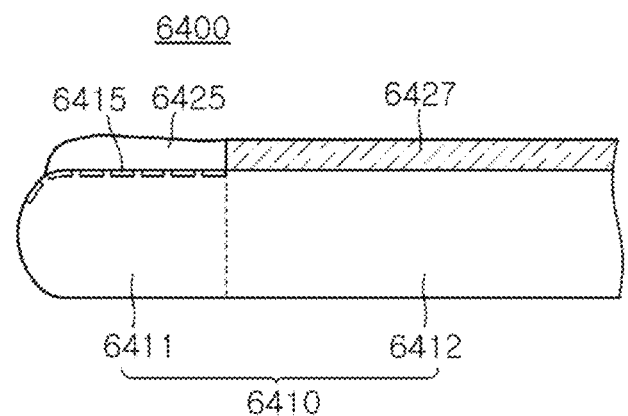

A nitride semiconductor layer 6400 on a silicon substrate illustrated in FIG. 35B may include a silicon substrate 6410 including an edge region 6411 and a main region 6412. A crack preventing portion 6415 may be formed by performing ion implantation on the silicon edge region 6411. The surface of the silicon edge region 6411 may be changed to a polycrystalline or amorphous form due to the ion implantation.

A nitride semiconductor thin film 6425 grown on the crack preventing portion 6415 may be grown in a polycrystalline or amorphous state, alleviating stress due to lattice constant mismatch in the interface. However, a nitride semiconductor thin film 6427 grown in the main region 6412 is formed such that a crystal on a surface thereof is oriented in a (111) direction, and thus, stress due to lattice constant mismatch is not alleviated.

(Embodiment B3)

Figure 35C:
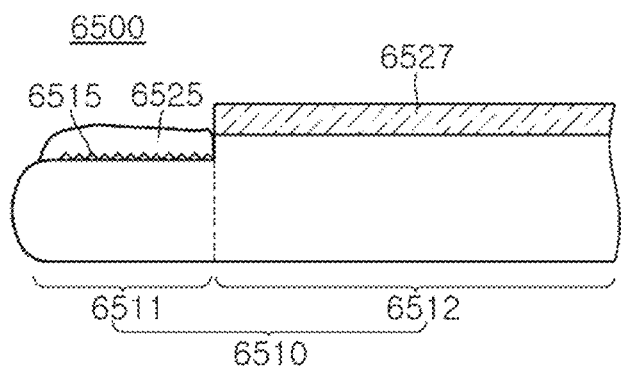

A nitride semiconductor layer 6500 on a silicon substrate illustrated in FIG. 35C may include a silicon substrate 6510 including an edge region 6511 and a main region 6512. A crack preventing portion 6515 may be formed by dry etching or wet etching only the edge region 6511 to roughen the surface.

A nitride semiconductor thin film 6525 grown on the crack preventing portion 6515 may be grown in a polycrystalline or amorphous state, and thereby stress due to lattice constant mismatch in the interface may be alleviated. However, a nitride semiconductor thin film 6527 grown in the main region 6512 is formed such that a crystal on a surface thereof is oriented in a (111) direction, and thus, stress due to lattice constant mismatch is not alleviated.

Thereafter, buffer layers 6120 to 6140 are formed on the silicon substrate 6110 (please refer to FIGS. 32B through 32D). The buffer layers 6120 to 6140 are prepared for growing a high quality nitride laminate with less cracks or dislocation and it may include a plurality of nitride semiconductor layers. Each of the plurality of nitride semiconductor layers may be formed of a material $Al_xIn_yGa_{1-x-y}N$, where $0 \le x \le 1$, $0 \le y < 1$, and $0 \le x+y \le 1$. For example, a layer, among the nitride semiconductor layers, which is in direct contact with the silicon substrate 6110 may be formed of AlN.

The buffer layers 6120 to 6140 may have a multilayer structure including a single layer of AlN, SiC, $Al_2O_3$, AlGaN, AlInGaN, AlInBGaN, AlBGaN, GaN, or XY, or combinations thereof. Here, X may be titanium (Ti), chromium (Cr), zirconium (Zr), hafnium (Hf), niobium (Nb), or tantalum (Ta), and Y may be nitrogen (N) or boron (B, $B_2$).

The buffer layers 6120 to 6140 and the device layer 6150 (please refer to FIG. 32E) may be formed according to a general semiconductor manufacturing process. For example, buffer layers 6120 to 6140 and the device layer 6150 may be formed through a metal organic chemical vapor deposition (MOCVD). An overall thickness of the buffer layers 6120 to 6140 and the device layer 6150 may be determined such that dislocation density may be equal to or lower than an appropriate level, and it may be about 3 um or greater. Also, in consideration of a difference in coefficients of thermal expansion between the silicon substrate 6110 and the buffer layers 6120 to 6140 and the device layer 6150, after a high temperature process, stress for canceling out stress generated when the high temperature is cooled to room temperature may be applied when the buffer layers 6120 to 6140 and the device layer 6150 are grown. For example, when coefficients of thermal expansion of the buffer layers 6120 to 6140 and the device layer 6150 are greater than that of the silicon substrate 6110, compressive stress may be applied during the high temperature process in order to cancel out tensile stress that may be generated during cooling.

The step of forming a buffer layer may include forming a nucleation layer 6120, forming the first buffer layer 6130 on the nucleation layer 6120, and forming the second buffer layer 6140 on the first buffer layer 6130.

Referring to FIG. 32B, the nucleation layer 6120 may be formed of AlN. The nucleation layer 6120 serves to form nucleus for epitaxial growth of a nitride semiconductor thin film on a silicon-based substrate. The nucleation layer 6120 may prevent a melt-back phenomenon, which means silicon of the substrate and gallium of the nitride single crystal react to form a eutectic metal. The formation of the AlN nucleation layer may start from a process of injecting an aluminum source such as trimethyl aluminum at an initial stage. The preliminary injection of the Al source may prevent the silicon-based substrate from being exposed to ammonia and then nitrated. For example, the nucleation layer 6120 may have a thickness ranging from tens to hundreds of nm.

Referring to FIG. 32C, the first buffer layer 6130 is formed of $Al_xIn_yGa_{1-x-y}N$, where $0 \leq x < 1$, $0 \leq y < 1$, and $0 \leq x+y < 1$. The first buffer layer 6130 may be formed as a layer mainly including AlGaN. A dislocation loop is formed at an interface between the first buffer layer 6130 and the second buffer layer 6140 (please refer to FIG. 32D) which will be grown later, and thereby dislocation density may be reduced. Also, the first buffer layer 6130 alleviates lattice mismatch and mismatch of coefficients of thermal expansion with the second buffer layer 6140 (please refer to FIG. 32D) which will be grown later, and thereby compressive stress may be generated effectively when a crystal is being grown, and tensile stress generated during cooling may be reduced. The first buffer layer 6130 may be formed as a nitride crystal containing aluminum (Al) and may be a single layer or a plurality of layers. For example, the first buffer layer 6130 may be a graded $Al_xIn_yGa_{1-x-y}N$ ($0 \leq x$, $y \leq 1$, $x+y \leq 1$) or $Al_{x1}In_{y1}Ga_{1-x1-y1}N/Al_{x2}In_{y2}Ga_{1-x2-y2}N$, ($0 \leq x1$, $x2$, $y1$, $y2 \leq 1$, $x1 \neq x2$ or $y1 \neq y2$, $x1+y1 \leq 1$, $x2+y2 \leq 1$) superlattice layer in which the content of some components such as AlGaN or Al increases or decreases linearly or stepwise. In a specific example, the first buffer layer 6130 may have a structure in which AlGaN and AlN are alternately stacked. For example, the first buffer layer 6130 may have a triple layer structure of AlGaN/AlN/AlGaN. The first buffer layer 6130 may include an intermediate layer therein. The intermediate layer may be inserted to maintain the compressive stress generation effect, and may have a thickness equal to or greater than a critical thickness.

(Embodiment C1)

Figure 36:
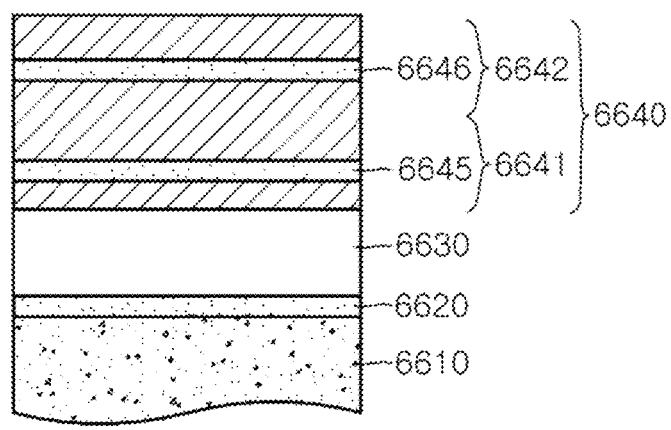
Figure 36:
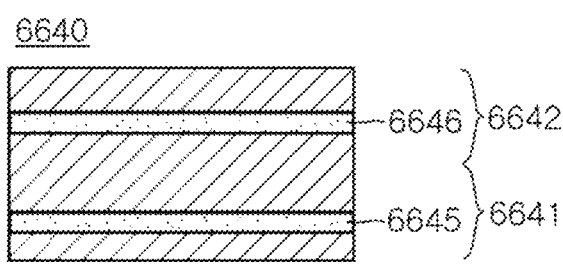

Referring to FIG. 36, the second buffer layer 6640 has a dislocation reduction function, and is formed of $Al_xIn_yGa_{1-x-y}N$, where $0 \leq x < 1$, $0 \leq y < 1$, and $0 \leq x+y < 1$. The second buffer layer 6640 effectively reduces dislocation therein to thus allow a nitride semiconductor layer having high crystallinity to be formed thereon.

For example, the step of forming the second buffer layer 6640 may include forming a masking layer 6645 in a first region 6641 formed to be contiguous with the first buffer layer 6630 and forming at least one intermediate layer 6646 in a second region 6642 formed after the first region 6641. The first region 6641 and the second region 6642 may be formed of GaN, the masking layer 6645 may be formed of SiN, and the at least one intermediate layer 6646 may be formed of AlGaN.

Dislocation density is reduced by the masking layer 6645, and this may be considered as an effect of blocking threading dislocation directly by the masking layer 6645 and a threading dislocation bending effect through an island facet.

Meanwhile, the second buffer layer 6640 may receive compressive stress from the first buffer layer 6630 having a relatively small lattice constant. The compressive stress is gradually relaxed as the thickness of the nitride semiconductor layer increases. However, when the masking layer 6645 is inserted, the compressive stress is blocked by the masking layer 6645. Also, a nitride semiconductor is grown as islands on the masking layer 6645, and when the islands coalesce, relative tensile stress occurs. The nitride semiconductor layer formed on the masking layer 6645 may be subjected to weaker compressive stress or tensile stress due to stress decoupling and island coalescence.

The at least one intermediate layer 6646 serves to apply compressive stress to the nitride semiconductor layer thereabove to compensate for compressive stress alleviated by the masking layer 6645. In an exemplary embodiment, the at least one intermediate layer 6646 may be inserted before the islands completely coalesce, in order to increase the effect of compensating for the alleviated compressive stress. In this case, the intermediate layer 6646 may be formed on an uneven surface to thus have an uneven form.

(Embodiment C2)

Figure 37:
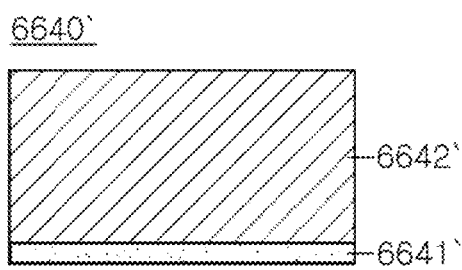

Referring to FIG. 37, in an exemplary embodiment, in an operation of forming a second buffer layer 6640', at least one of growth conditions among a growth temperature, growth pressure, and a Group V/III mole ratio for growing a first region 6641' is adjusted to be different from a growth condition for growing a second region 6642' to minimize a three-dimensional growth and enhance crystallinity. The first region 6641' and the second region 6642' may be formed to have the same composition.

As set forth above, the semiconductor light emitting device according to exemplary embodiments of the present inventive concept may have high light extraction efficiency, a uniform current distribution, and high mass-productivity at low costs.

While exemplary embodiments have been shown and described above, it will be apparent to those skilled in the art that modifications and variations could be made without departing from the scope of the invention as defined by the appended claims.

What is claimed is:

1. A semiconductor light emitting device comprising:
    a semiconductor stack having first and second main surfaces opposing each other, and comprising first and second conductivity-type semiconductor layers respectively defining the first and second main surfaces, and an active layer interposed between the first and second conductivity-type semiconductor layers;
    a plurality of contact holes penetrating the second conductivity-type semiconductor layer and the active layer;
    a first electrode layer disposed on the second main surface of the semiconductor stack, the first electrode layer extending and being connected to one region of the first conductivity-type semiconductor layer through the contact holes;
    a second electrode layer disposed between the semiconductor stack and the first electrode layer and connected to the second conductivity-type semiconductor layer; and
    first and second interconnected bumps comprising:
        first and second under bump metallurgy (UBM) layers respectively connected to the first and second electrode layers;
        first and second intermetallic compound (IMC) layers respectively disposed on the first and the second UBM layers;
        first and second solder bumps respectively disposed on the first and second IMC layers,
    wherein the solder bumps are bonded to the UBM layers by the IMC layers; and first and second barrier layers covering lateral surfaces of the first and second UBM layers respectively,
    wherein the first and second interconnected bumps are disposed opposite to the first main surface.

2. The semiconductor light emitting device of claim 1, further comprising an insulator disposed between the first electrode layer and second electrode layer.

3. The semiconductor light emitting device of claim 1, wherein the contact holes penetrate the second electrode layer to thereby be connected to the first electrode layer.

4. The semiconductor light emitting device of claim 1, further comprising:
    a support substrate disposed on the first electrode layer; and first and second conductive vias respectively connected to the first and second interconnected bumps,
wherein the first conductive via penetrates the support substrate to thereby be connected to the first electrode layer, and the second conductive via penetrates the support substrate and the first electrode layer to thereby be connected to the second electrode layer.

5. The semiconductor light emitting device of claim 4, further comprising first and second electrode pads respectively connected to the first and second conductive vias, wherein the electrode pads are interposed between the conductive vias and the interconnected bumps.

6. The semiconductor light emitting device of claim 4, further comprising an insulator, covering lateral surfaces of the first and second conductive vias and a portion of a bottom surface of the support substrate, and exposing bottom surfaces of the first and second conductive vias.

7. The semiconductor light emitting device of claim 1, wherein an irregular pattern is formed on a surface of the first conductivity-type semiconductor layer opposite to another surface of the first conductivity-type semiconductor layer interfacing with the active layer.

8. The semiconductor light emitting device of claim 1, wherein the barrier layers have lower wettability to the IMC layers and the solder bumps than the UBM layers.

9. The semiconductor light emitting device of claim 1, wherein the barrier layers comprise oxide layers containing at least one component constituting the UBM layers.

10. The semiconductor light emitting device of claim 1, wherein the lateral surfaces of the UBM layers are inclined with respect to the second main surface.

11. The semiconductor light emitting device of claim 1, wherein the lateral surfaces of the UBM layers are perpendicular to the second main surface.

12. A semiconductor light emitting device having a first conductivity-type semiconductor layer, an active layer, a second conductivity-type semiconductor layer, a second electrode layer, a multilayered reflective structure, a first electrode layer, and a support substrate sequentially laminated, wherein:
the second electrode layer has an exposed area at the interface between the second electrode layer and the second conductivity-type semiconductor layer;
the first electrode layer comprises at least one contact hole electrically connected to the first conductivity-type semiconductor layer, electrically insulated from the second conductivity-type semiconductor layer and the active layer, and extending from one surface of the first electrode layer to at least part of the first conductivity-type semiconductor layer; and
the multilayered reflective structure covering lateral surfaces of the at least one contact hole located between the at least one contact hole and the active layer, and the multilayered reflective structure exposing bottom surfaces of the at least one contact hole, wherein the multilayered reflective structure comprises a plurality of insulating layers, and wherein the plurality of insulating layers having different refractive indices are alternately stacked.

13. The semiconductor light emitting device of claim 12, further comprising an electrode pad unit formed at the exposed area of the second electrode layer.

14. The semiconductor light emitting device of claim 12, wherein the exposed area of the second electrode layer is formed at the edge of the semiconductor light emitting device.

15. The semiconductor light emitting device of claim 12, wherein an irregular pattern is formed on the surface of the first conductivity-type semiconductor layer.

16. The semiconductor light emitting device of claim 12, wherein the multilayered reflective structure is a distributed Bragg reflector (DBR) comprising first and second insulating layers, and wherein the first and second insulating layer having different refractive indices from each other are alternately stacked.

17. The semiconductor light emitting device of claim 12, wherein each of the plurality of insulating layers is composed of one selected from the group consisting of silicon oxide, silicon nitride, aluminum oxide, hafnium oxide, titanium dioxide, zirconium oxide, and combinations thereof.

18. A semiconductor light emitting device having a first conductivity-type semiconductor layer, an active layer, a second conductivity-type semiconductor layer, a second electrode layer, a multilayered reflective structure, a first electrode layer, and a support substrate sequentially laminated, wherein:
the second electrode layer has an exposed area at the interface between the second electrode layer and the second conductivity-type semiconductor layer;
the first electrode layer comprises at least one contact hole electrically connected to the first conductivity-type semiconductor layer, electrically insulated from the second conductivity-type semiconductor layer and the active layer, and extending from one surface of the first electrode layer to at least part of the first conductivity-type semiconductor layer;
the multilayered reflective structure disposed between the first electrode layer and the active layer, covering lateral surfaces of the at least one contact hole and exposing bottom surfaces of the at least one contact hole, wherein the multilayered reflective structure comprises a plurality of insulating layers, and wherein the plurality of insulating layers having different refractive indices are alternately stacked; and
the exposed area of the second electrode layer is a region exposed by a via hole formed through the first conductivity-type semiconductor layer, the active layer, and the second conductivity-type semiconductor layer.

19. The semiconductor light emitting device of claim 18, wherein the diameter of the via hole increases in a direction from the second electrode layer toward the first conductivity-type semiconductor layer.

20. The semiconductor light emitting device of claim 18, further comprising an additional multilayered reflective structure disposed on a lateral surface of the via hole.

* * * * *